(12) United States Patent
Onaka

(10) Patent No.: US 9,250,385 B1
(45) Date of Patent: Feb. 2, 2016

(54) OPTICAL TRANSMISSION MEDIUM AND OPTICAL AMPLIFIER

(71) Applicant: FUJITSU LIMITED, Kawasaki-shi, Kanagawa (JP)

(72) Inventor: Miki Onaka, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/746,010

(22) Filed: Jun. 22, 2015

(30) Foreign Application Priority Data

Aug. 19, 2014  (JP) .................................. 2014-166350

(51) Int. Cl.
   *G02B 6/02* (2006.01)
   *H01S 3/30* (2006.01)
   *G02B 6/036* (2006.01)

(52) U.S. Cl.
   CPC ............ *G02B 6/02042* (2013.01); *G02B 6/036* (2013.01); *H01S 3/302* (2013.01)

(58) Field of Classification Search
   CPC . H01S 3/067; H01S 3/06754; H01S 3/06737; H01S 3/094007; H01S 3/094046
   USPC ......................................................... 359/341.1
   See application file for complete search history.

(56) References Cited

U.S. PATENT DOCUMENTS

| 5,566,196 A  * | 10/1996 | Scifres ............... G02B 6/02042 372/6 |
| 7,684,449 B2 * | 3/2010 | Ohsono .............. B23K 26/0626 372/6 |
| 2011/0279888 A1 | 11/2011 | Fini et al. |

FOREIGN PATENT DOCUMENTS

| JP | 2002-338308 | 11/2002 |
| JP | 2009-251376 | 10/2009 |
| JP | 2013-522914 | 6/2013 |
| JP | 2013-235139 | 11/2013 |
| WO | WO 2011/116075 | 9/2011 |

* cited by examiner

*Primary Examiner* — Mark Hellner
(74) *Attorney, Agent, or Firm* — Staas & Halsey LLP

(57) ABSTRACT

An optical transmission medium includes: a plurality of cores; a first cladding that covers each of the plurality of cores; a second cladding that covers a plurality of first claddings; and a reflection layer that covers the second cladding and has reflection characteristics with respect to a wavelength band of multimode light.

10 Claims, 24 Drawing Sheets

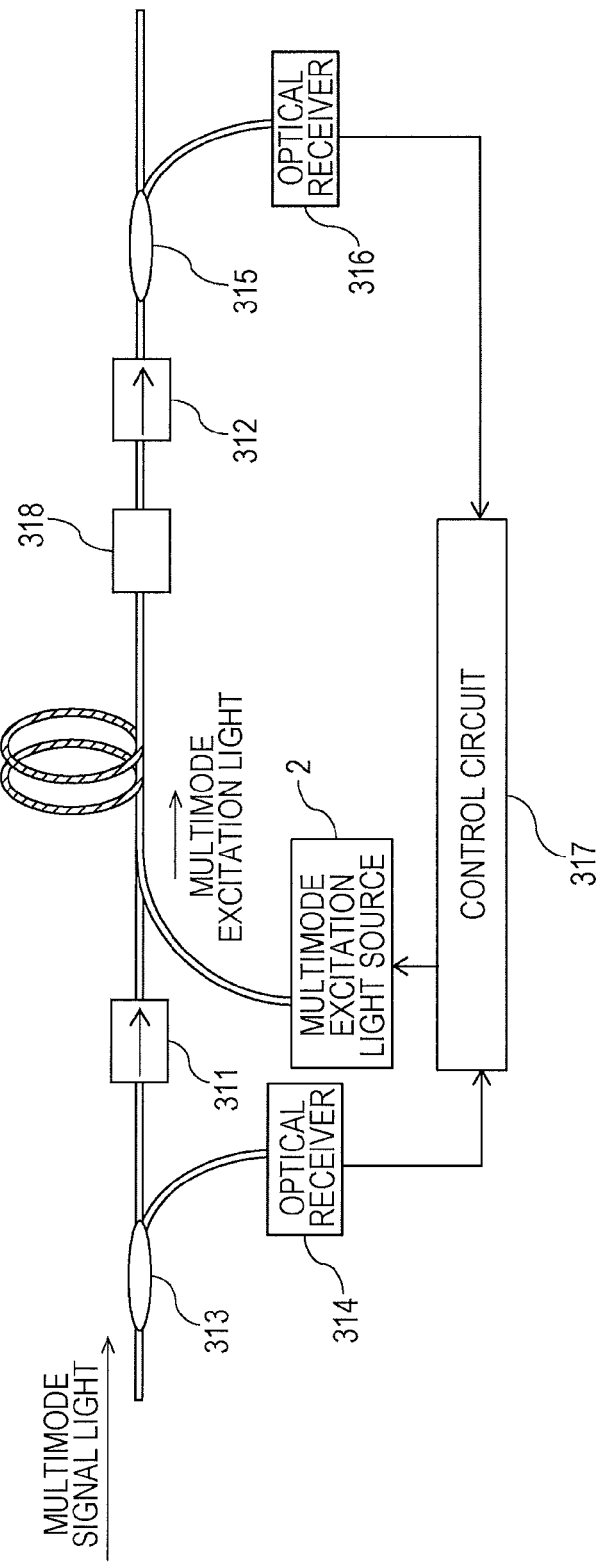

FIG. 25

| OPTICAL AMPLIFIER | FIBER CORE NUMBER | TRANSMISSION MODE | | APPLICATION EFFECT |
|---|---|---|---|---|
| | | SIGNAL LIGHT | EXCITATION LIGHT | |
| DISTRIBUTED RAMAN AMPLIFIER (OPTICAL TRANSMISSION PATH & EXCITATION LIGHT INTRODUCING STRUCTURE) | SINGLE | SINGLE | SINGLE | – |
| | | | MULTI | YES |
| | | MULTI | MULTI | YES |
| | MULTI | SINGLE | SINGLE | – |
| | | | MULTI | YES |
| | | MULTI | MULTI | YES |
| RARE EARTH-ADDED OPTICAL FIBER AMPLIFIER | SINGLE | SINGLE | SINGLE | – |
| | | | MULTI | YES |
| | | MULTI | MULTI | YES |
| | MULTI | SINGLE | MULTI | YES |
| | | MULTI | MULTI | YES |
| CONCENTRATED RAMAN AMPLIFIER | SINGLE | SINGLE | SINGLE | – |
| | | | MULTI | YES |
| | | MULTI | MULTI | YES |
| | MULTI | SINGLE | SINGLE | – |
| | | MULTI | MULTI | YES |
| | | | MULTI | YES |

OPTICAL TRANSMISSION MEDIUM AND OPTICAL AMPLIFIER

CROSS-REFERENCE TO RELATED APPLICATION

This application is based upon and claims the benefit of priority of the prior Japanese Patent Application No. 2014-166350, filed on Aug. 19, 2014, the entire contents of which are incorporated herein by reference.

FIELD

The embodiments discussed herein are related to an optical transmission medium and an optical amplifier.

BACKGROUND

In optical communication systems, increases in the transmission capacity and transmission distance of optical communication have been achieved by using wavelength multiplexing (WDM) technology and optical amplification relay technology. Furthermore, research and development is also being carried out into optical communication systems in which multicore optical fibers having a plurality of cores formed in each optical fiber are used in optical transmission paths in order to achieve further increases in transmission capacity (for example, see Japanese Laid-open Patent Publication No. 2009-251376, Japanese Laid-open Patent Publication No. 2002-338308, Japanese Laid-open Patent Publication No. 2013-235139, and International Publication Pamphlet No. WO 2011/116075).

In an optical fiber used as an optical transmission medium or an optical amplification medium, there are cases where the refractive index (may be referred to as the "refractive index profile") between a core and a cladding, for example, is controlled in order to improve the effect of trapping light that is to be transmitted or amplified.

However, there is a limit to the light trapping effect that is able to be obtained with refractive index control. Therefore, loss may occur in light that propagates through the optical fiber. Furthermore, when refractive index control is to be carried out in a multicore optical fiber, there are cases where the optical fiber structure itself becomes complex and there is no choice but to increase the optical fiber diameter.

In one aspect, one objective of the present disclosure is to improve the effect of trapping multimode light that propagates through an optical transmission medium, within the optical transmission medium without resorting to refractive index control, to achieve an improvement in performance with regard to optical transmission and optical amplification for which the optical transmission medium is used.

Furthermore, in one aspect, an optical amplifier includes: the optical transmission medium; a multimode excitation light source that outputs multimode excitation light that is the aforementioned multimode light; and an excitation light introducing structure that introduces the multimode excitation light that is output from the multimode excitation light source, to a region inside a reflection layer of the optical transmission medium.

SUMMARY

According to an aspect of the embodiments, an optical transmission medium includes: a plurality of cores; a first cladding that covers each of the plurality of cores; a second cladding that covers a plurality of first claddings; and a reflection layer that covers the second cladding and has reflection characteristics with respect to a wavelength band of multimode light.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 24 is a block diagram depicting a configuration example of an optical amplifier in which the rare earth-added optical fiber having the reflection layer exemplified in FIG. 22 is used in an optical amplification medium; and FIG. 25 is a table depicting an example of the application scope and application effects of an optical fiber having a reflection layer according to an embodiment.

DESCRIPTION OF EMBODIMENTS

Figure 1:
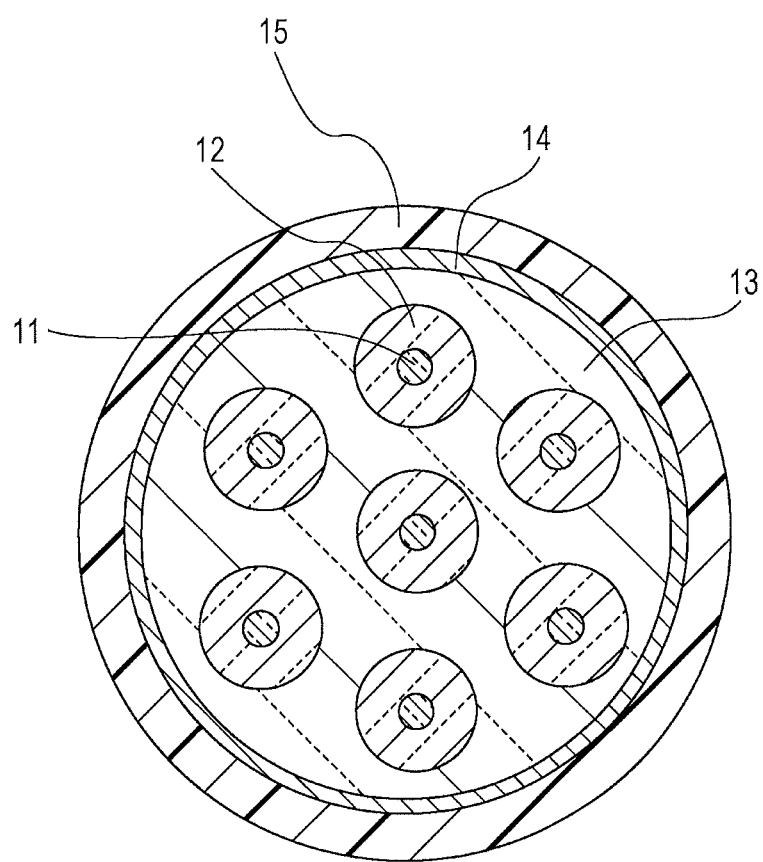
FIG. 1 is a drawing schematically depicting an end surface (or a cross section orthogonal to the axial direction) of a multicore optical fiber serving as an example of an optical transmission medium according to an embodiment.

Hereinafter, embodiments of the present disclosure are described with reference to the drawings. However, the embodiments described hereinafter are merely examples and are not intended to exclude various modifications or technology applications that are not explicitly indicated hereinafter. Furthermore, the various kinds of exemplary modes described hereinafter may be implemented by being combined as appropriate. Note that portions denoted by the same symbols in the drawings used for the embodiments hereinafter represent the same or similar portions unless otherwise specifically stated.

FIG. 1 is a drawing schematically depicting an end surface (or a cross section orthogonal to the axial direction) of a multicore optical fiber serving as an example of an optical transmission medium according to an embodiment.

The multicore optical fiber 1 depicted in FIG. 1 is, for example, provided with a plurality of cores 11 (seven cores in FIG. 1) and first claddings 12 that cover the outer periphery of the individual cores 11. Note that the number of cores 11 (may be referred to as the "multicore number") is not limited to seven cores as in FIG. 1 and there may be two cores or more.

Each of the cores 11 has a refractive index that is higher than the refractive index of the claddings 12, for example. Consequently, light that is input to the cores 11 at an angle of incidence that is equal to or less than a critical angle propagates in a direction parallel to the axes of the cores 11 while being totally reflected at the boundary surfaces between the cores 11 and the claddings 12.

Thus, the claddings 12 act in such a way that the input light is substantially trapped within the cores 11. Light that is propagated (may be referred to as "guided") through the cores 11 may be single-mode light or may be multimode light.

Note that a direction parallel to the axes of the cores 11 may be referred to as the "longitudinal direction" of the multicore optical fiber 1. The "longitudinal direction" is, in other words, a direction parallel to the propagation direction of light that propagates through the multicore optical fiber 1.

A set of a core 11 and a cladding 12 may be referred to as an "optical fiber" or an "optical waveguide" and is sometimes referred to as an "optical waveguide 11-12" for convenience. The cores 11 may have multimode light input thereto as an example of signal light and may propagate the multimode light. Note that light that is input to the cores 11 at an angle of incidence that is greater than the critical angle becomes radiation mode light and propagates (may be referred to as "leaks out") to the claddings 12 without being trapped within the cores 11.

A second cladding 13 is formed at the outer periphery of the claddings 12 in such a way that a space between the claddings 12 is filled in, for example. In other words, a plurality (seven, for example) of optical waveguides 11-12 are formed within the second cladding 13. The second cladding 13 may have a refractive index that is lower than the refractive index of the cores 11, and may have a refractive index that is lower than the refractive index of the first claddings 12, for example.

However, the structure of the multicore optical fiber 1 depicted in FIG. 1 is merely an example, and the relationship between the claddings 12 and 13 regarding the magnitudes of the refractive indexes thereof may be reversed according to the cladding structure used in the multicore optical fiber 1.

In the multicore optical fiber 1, refractive index control for the cladding structure that covers the cores 11 may be implemented in such a way that there is no interference among the light beams that propagate through the plurality of cores 11, for example. Consequently, the refractive indexes of the plurality of claddings included in the cladding structure may be appropriately set to values with which light interference among the cores 11 is able to be minimized.

Radiation mode light that leaks out from the cores 11 to the first claddings 12 is reflected toward the first claddings 12 at the boundary surface with the second cladding 13. Thus, the second cladding 13 acts in such a way that radiation mode light that has leaked out from the first claddings 12 is substantially trapped within the claddings 12.

A reflection layer 14 is formed at the outer periphery of the second cladding 13, for example. The reflection layer 14 has the characteristics of reflecting multimode light toward the cladding 13 in the wavelength band of the multimode light, for example. Consequently, multimode light that has become radiation mode light is reflected at the reflection layer 14 and returned to within the cladding 13.

In other words, the reflection layer 14 acts in such a way that multimode light is substantially trapped inside the reflection layer 14. Note that the reflection characteristics of the reflection layer 14 may be characteristics with which multimode light is reflected at a higher reflectance than the reflection characteristics exhibited by a resin layer 15, which is described hereinafter, with respect to the multimode light, for example.

Multimode light may be input all at once to each core 11 and the claddings 12 and 13 without distinction therebetween (may be referred to as "coupling" or "introducing"), in the region inside the reflection layer 14 of the multicore optical fiber 1, separate from the light that propagates through the cores 11.

Therefore, the region inside the reflection layer 14 of the multicore optical fiber 1, namely the region that includes each core 11 and the claddings 12 and 13, is sometimes referred to as a "multimode light introduction region" for convenience hereinafter.

Multimode light that is introduced to the "multimode light introduction region" may include excitation light (sometimes referred to as "multimode excitation light" hereinafter) that is used for distributed Raman amplification, for example. Consequently, the "multimode light introduction region" may be referred to as an "excitation light introduction region".

The reflection layer 14 may be a reflection medium layer in which a metal material is used, and may be an alloy metal film, for example. For the alloy, it is preferable to use a material that has a thermal expansion coefficient with which the difference with the thermal expansion coefficient of quartz (may be referred to as a "silica ($SiO_2$) material"), which is used for the material of the cores 11 and the claddings 12 and 13, is as small as possible. This is because if the difference between the thermal expansion coefficients is large, there is concern that a physical stress strain may occur in the multicore optical fiber 1 in response to a change in the temperature of the external environment and the reflection layer 14 may detach and separate.

For example, in contrast to the linear expansion coefficient of quartz being of the order of 0.4 to $0.55 \times 10^{-6}$/K (Kelvin), the linear expansion coefficient of a normal metal such as iron, steel, or stainless steel is of the order of 0.1 to $0.3 \times 10^{-4}$/K, and there is a double-digit difference with quartz. Therefore, if the metal film 14 is formed on (covers) quartz using a normal metal material, there is concern that the metal film 14 may detach and separate due to a change in the temperature of the external environment.

One possible example of a metal material having a lower linear expansion coefficient than a normal metal is an invar alloy, which is an alloy of iron (Fe) and nickel (Ni). An invar alloy is an example of a metal in which the property that volume changes due to magnetostriction and thermal expansion due to lattice vibration offset each other is used to suppress the linear expansion coefficient to be lower than in a normal metal.

By adjusting the composition ratio of Fe and Ni, the linear expansion coefficient of an invar alloy is able to be controlled in a range of the order of 0.1 to $3.0 \times 10^{-6}$/K. Consequently, the linear expansion coefficient of the metal film 14 is able to be brought as close as possible to (ideally made to match) the linear expansion coefficient of quartz.

Thus, if an invar alloy is used for the metal film 14, the occurrence of a stress strain that accompanies a temperature change is able to be suppressed or reduced to restrict the metal film 14 from detaching and separating. In other words, it is possible to realize strong adhesion between the metal film 14 and the cladding 13, which is a silica material, and dimensional stability of the multicore optical fiber 1.

Consequently, it is possible to provide a multicore optical fiber 1 having improved reliability with respect to changes in environmental conditions such as temperature changes. Furthermore, the mechanical strength of the multicore optical fiber 1 may also be improved by adjusting the thickness of the invar alloy metal film 14.

To give a nonrestrictive example of the composition of the invar alloy used for the metal film 14, the content of Fe and Ni with respect to the entire alloy is 50% or more and the content of Ni is of the order of 36 to 42%. For example, in the invar alloy, the Ni content may be 36% and the Fe content may be 64%. With an invar alloy having this composition, it is possible to form a metal film 14 having a linear expansion coefficient of the order of 0.13 to $1.0 \times 10^{-6}$/K.

Note that a Kovar alloy having a composition that includes cobalt (Co) in addition to Fe and Ni may be applied for the metal film 14. Similar to an invar alloy, a Kovar alloy also has a smaller linear expansion coefficient than a normal metal, and is an example of a metal with which it is possible to approach the linear expansion coefficient of quartz by controlling the composition ratio.

If the film thickness (t) of the metal film 14 is too low, there is a risk of it not being possible to maintain suitable reflection characteristics with respect to multimode light, and if the film thickness is too great, there is a risk of the multicore optical fiber 1 being difficult to handle and being difficult to wire, and it is therefore important for the film thickness to be set appropriately.

For example, the film thickness t may be a value of a range with which it is possible to maintain reflection characteristics with respect to multimode light while reducing stress strain that accompanies temperature changes and, to give a nonrestrictive example, may be a value that satisfies $1.0 \mu m < t < 100 \mu m$. More preferably, the film thickness t may be a value that satisfies the order of 10 micrometers<t<several tens of micrometers.

Note that if t=approximately 0.1 μm or less, there is a risk of the film being too thin, light passing through the metal film 14, and the expected reflection characteristics not being obtained. Furthermore, if t=approximately 100 μm or more, there is a risk of the film being too thick and it taking longer to form the metal film 14 (the time desired for a chemical plating process that includes heating time described hereinafter, for example). However, if the objective is to improve the mechanical strength of the multicore optical fiber 1, the film thickness t may be set to 100 μm or more. Note that a specific example of a method for forming the metal film 14 is described hereinafter.

As exemplified in FIG. 1, the resin layer 15 may be formed at the outer periphery of the metal film 14. The resin layer 15 may be formed by coating the outer periphery of the metal film 14 with a coating of a resin material used in a normal optical fiber manufacturing process (may be referred to as "resin finishing"). For example, a silicon resin may be used for the resin material. The resin layer 15 may be treated as functioning as a protective layer for the multicore optical fiber 1.

When multimode light is input to the multimode light introduction region of the multicore optical fiber 1 having the aforementioned structure, a portion of the multimode light that has become radiation mode light is guided in the longitudinal direction of the multicore optical fiber 1 while being repeatedly reflected and vertically blocked in the radial direction by the reflection layer 14.

Consequently, the effect of trapping the multimode light within the multicore optical fiber 1 is improved, and propagation loss of the multimode light is able to be limited. If excitation light (multimode excitation light for distributed Raman amplification, for example) is included in the multimode light, propagation loss of the excitation light may be reduced such that excitation efficiency is improved.

Furthermore, light beams that propagate through the individual cores 11 are able to be amplified all at once by the multimode excitation light. Since the individual cores 11 do not have to be separately targeted for excitation, the structure of the multicore optical fiber 1 does not become complex. Furthermore, complex refractive index control and diameter enlargement do not have to be carried out with respect to the multicore optical fiber 1.

For example, it is thought that multicladding structures that trap excitation light in each core 11 would have to be introduced in order to separately excite the propagated light of the individual cores 11, but the optical fiber structure itself would become complex and refractive index control would also become difficult.

There are cases where refractive index control is carried out in the multicore optical fiber 1 between the individual cores 11 and the peripheral material and structure in order to suppress signal light crosstalk between the cores 11. Refractive index control would become even more difficult if multicladding structures were then additionally introduced for the individual cores 11.

Refractive index control, for example, is carried out by adding germanium (Ge) or fluorine (F) to a quartz material to be used for the cores or claddings, but refractive index control by adding Ge or F is difficult in the present state and it is difficult to obtain a sufficient light trapping effect.

Therefore, there is a risk that introducing a multicladding structure for each core 11 may result in the optical fiber structure becoming complex and the manufacturing yield declining. Furthermore, there is a risk of there being no choice but to increase the optical fiber diameter in order to realize suitable refractive index control.

As a result, the merit of the multicore optical fiber 1 of "being able to obtain an optical transmission capacity of a multiple corresponding to the multicore number while having a cross-sectional area that is substantially the same as the cross-sectional area of a known single-core fiber" may be lost.

In contrast to this, with the multicore optical fiber 1 having the metal film 14 exemplified in FIG. 1, the optical fiber structure does not become complex and, furthermore, complex refractive index control and enlargement of the optical fiber diameter are able to be rendered superfluous.

Next, an example in which the multicore optical fiber 1 having the structure exemplified in FIG. 1 is used for an optical transmission/amplification medium to subject signal light to distributed Raman amplification will be described with reference to FIG. 2.

Figure 2:
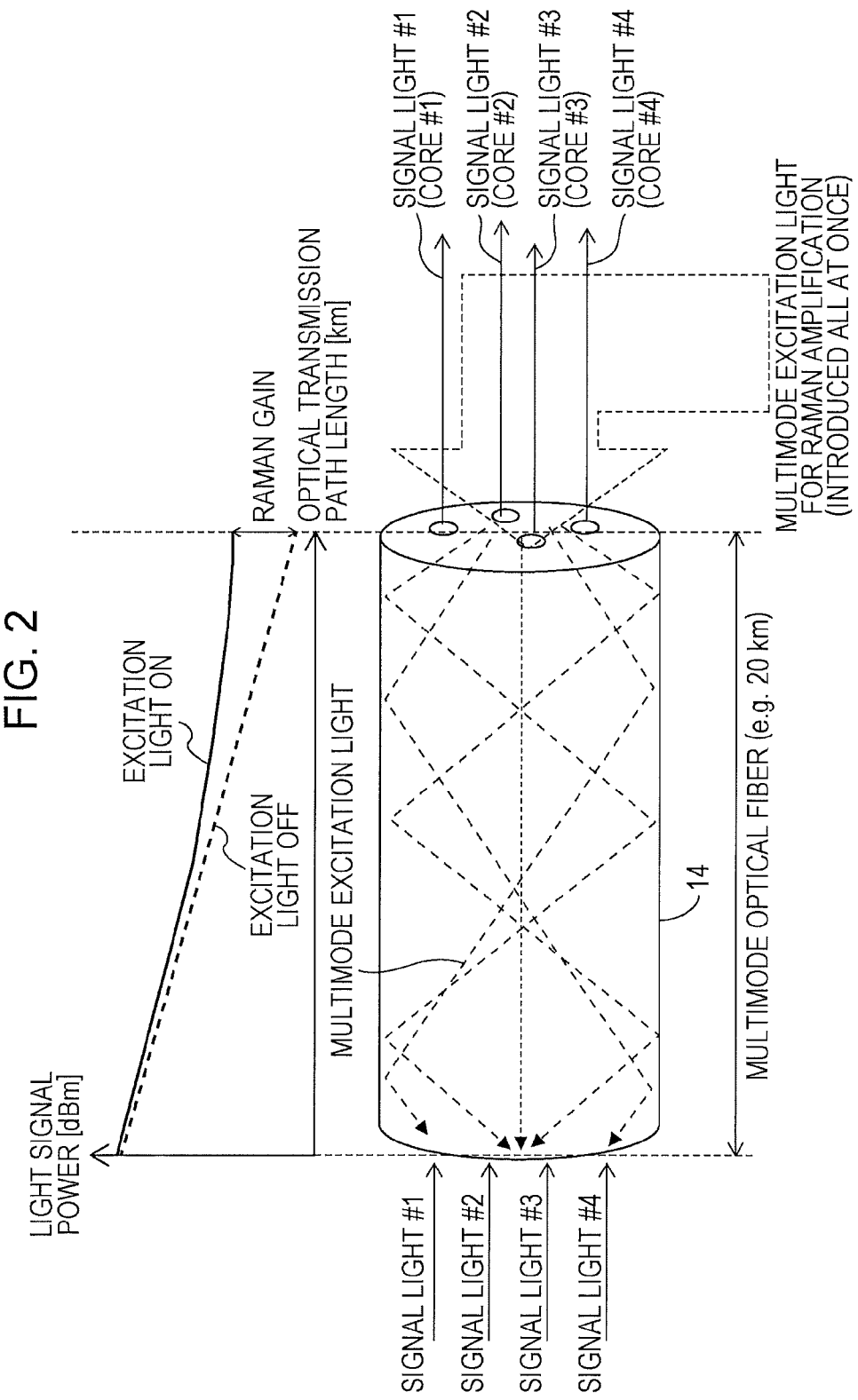
FIG. 2 is a schematic drawing illustrating a mode in which the multicore optical fiber exemplified in FIG. 1 is used in distributed Raman amplification.

The way in which signal light beams #1 to #4 are each input to four cores 11 (#1 to #4) of the multicore optical fiber 1 is exemplified in FIG. 2. Furthermore, the way in which multimode excitation light is input to a region inside the reflection layer 14, of a fiber cross section on the opposite side to the input side for the signal light beams #1 to #4 is exemplified in FIG. 2.

In other words, the signal light beams #1 to #4 are each separately input to the cores 11 of the multicore optical fiber 1, whereas the multimode excitation light beams are input all at once to the multimode light introduction region from the opposite direction to the input direction of the signal light beams #1 to #4.

In the multicore optical fiber 1, the signal light beams #1 to #4 are each backward-excited by the multimode excitation light propagating in the opposite direction to the propagation direction of the signal light beams #1 to #4. Compared with forward excitation in which excitation is carried out in a state in which signal light power is high, backward excitation may suppress a decline in transmission characteristics caused by a non-linear effect.

For example, when the multimode excitation light beams are input all at once to the excitation light introduction region of the multicore optical fiber 1, a portion thereof becomes radiation mode light and is propagated in the axial direction of the multicore optical fiber 1 while being repeatedly reflected by the reflection layer 14 formed in the external diameter portion of the second cladding 13.

Figure 3:
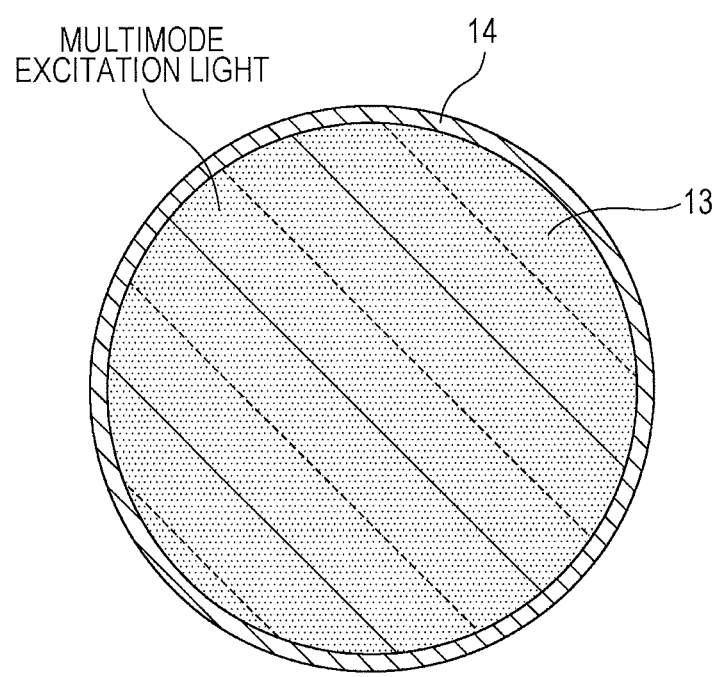
FIG. 3 is a cross-sectional drawing schematically depicting the way in which multimode excitation light propagates through the entire region inside a reflection layer of the multicore optical fiber exemplified in FIG. 1.
Figure 4:
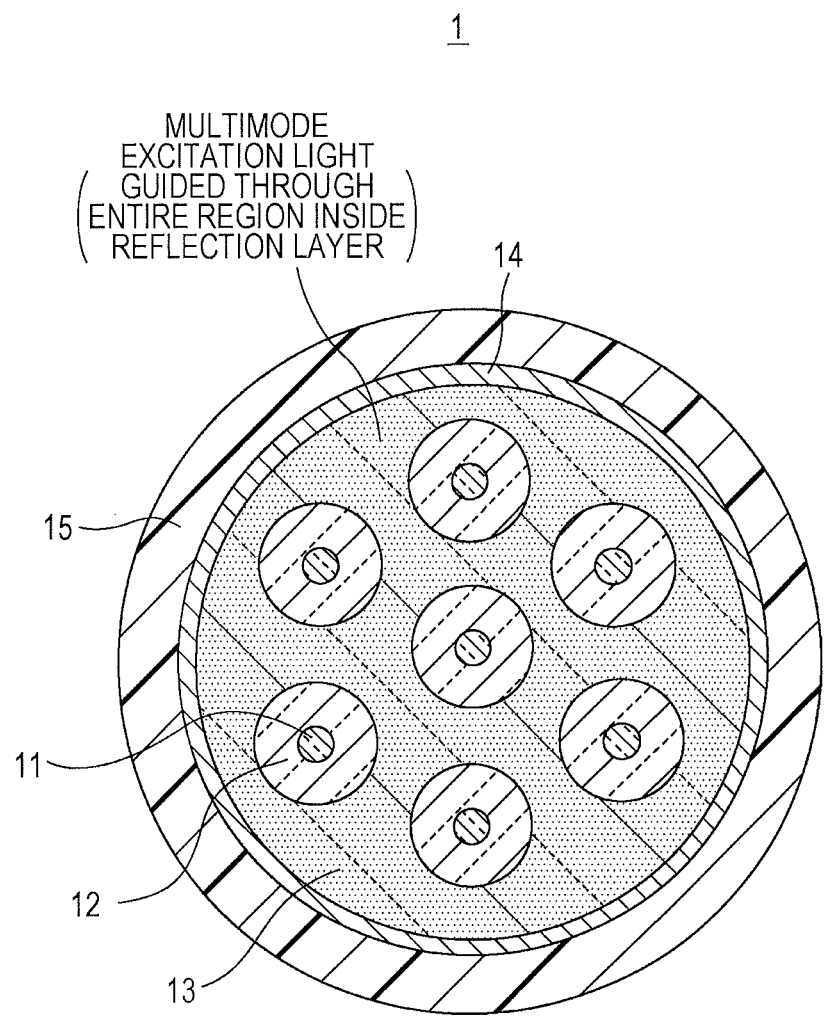
FIG. 4 is a cross-sectional drawing schematically depicting the way in which multimode excitation light propagates through the entire region inside the reflection layer of the multicore optical fiber exemplified in FIG. 1.

As a result of the radiation mode light being repeatedly reflected by the reflection layer 14, mode conversion of the multimode excitation light is promoted and the modes are diversified as exemplified in the schematic cross-sectional drawings of FIG. 3 and FIG. 4. In other words, in the multicore optical fiber 1, the multimode excitation light is guided through the entire region inside the reflection layer 14 while being vertically blocked in all directions, and it therefore becomes easy for the excitation light power to be uniformly distributed across that entire region.

Here, the greater the region in which the signal light and the excitation light overlap in the multicore optical fiber 1, the more the excitation efficiency of the signal light that propagates through the cores 11 improves. Therefore, as exemplified in FIG. 3 and FIG. 4, by making the distribution of excitation light power uniform in the radial direction of the multicore optical fiber 1, it becomes possible to enlarge the overlapping region and improve the excitation efficiency of the signal light.

Figure 5:
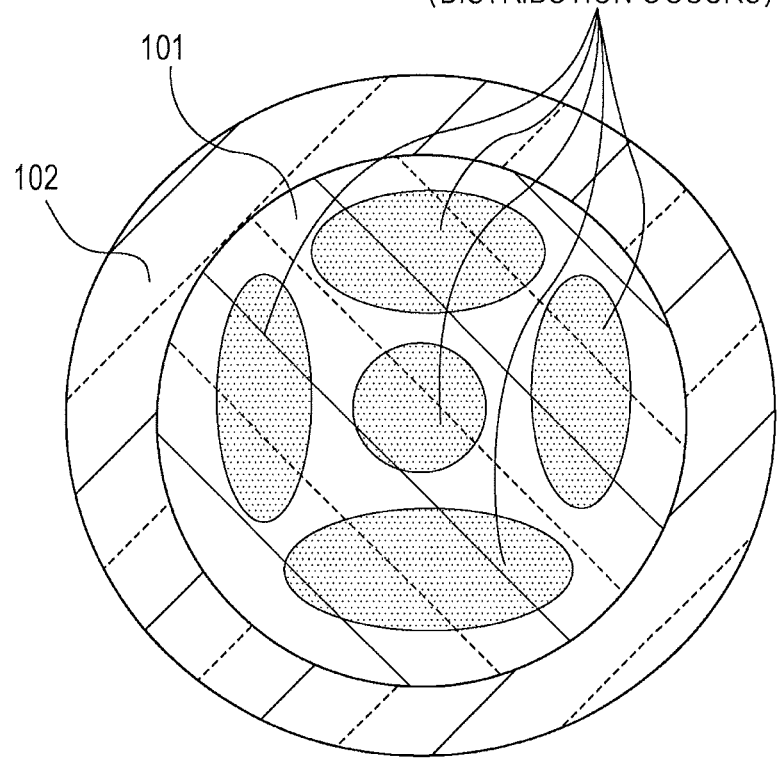
FIG. 5 is a cross-sectional drawing schematically depicting the occurrence of a deviation in the power distribution of multimode excitation light propagating through a multicore optical fiber that does not have a reflection layer.

In contrast to this, in an optical fiber 100 having a double cladding structure that does not include the reflection layer 14 such as that exemplified in the schematic cross-sectional drawing of FIG. 5, the light trapping effect is adjusted due to refractive index control between claddings 101 and 102; however, there is likely to be a limit to the number of excitation light modes. Therefore, there is likely to be a deviation in the power distribution of the multimode excitation light, and the overlapping between the signal light and the excitation light is not sufficient.

Note that the reflection layer 14 illustrated in FIG. 1 may be formed in a length corresponding to at least the effective length of the distributed Raman amplification in the longitudinal direction excluding the end surfaces of the multicore optical fiber 1. Distributed Raman amplification is one example of optical amplification. Other possible examples of optical amplification include concentrated Raman amplification and concentrated amplification in which a rare earth-added optical fiber is used in an optical amplification medium.

The "effective length" of optical amplification may be treated as corresponding to the length desired for an optical amplification medium to obtain a sufficient amplification gain by excitation light being introduced, for example. With distributed Raman amplification, as a nonrestrictive example, the "effective length" may be of the order of 20 km to 25 km. The way in which the reflection layer 14 is formed on the cladding 13 across the entire axial length of the multicore optical fiber 1, which has a length corresponding to an effective length of 20 km, is exemplified in FIG. 2 as a nonrestrictive example.

However, excitation efficiency may be improved by improving the signal light and excitation light overlapping property as previously mentioned as long as the reflection layer 14 is formed in at least the "effective length", and therefore the reflection layer 14 may be formed in the longitudinal direction in only a portion of the multicore optical fiber 1.

Figure 6:
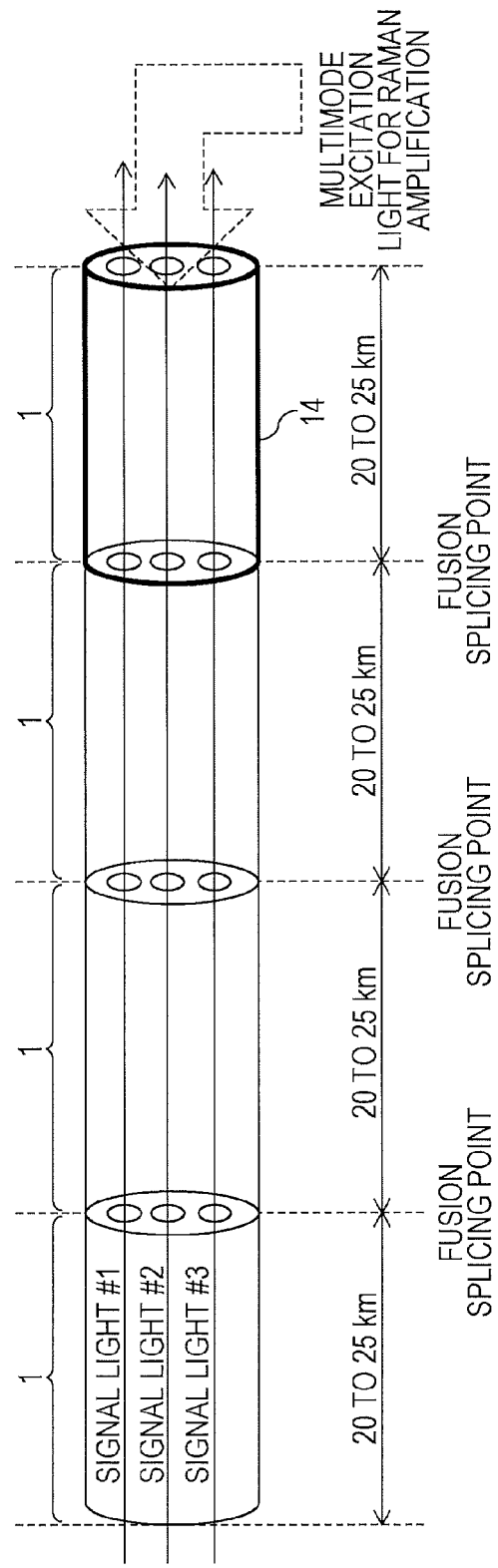
FIG. 6 is a drawing schematically depicting the way in which the reflection layer of the multicore optical fiber exemplified in FIG. 1 is formed in a length corresponding to the effective length of the distributed Raman amplification.

For example, as schematically exemplified in FIG. 6, a scenario is assumed in which four multicore optical fibers 1 each having a length of 20 km to 25 km are fusion-spliced in series to realize a transmission distance of 80 to 100 km. In this case, the reflection layer 14 may be formed only in the multicore optical fiber 1 of the first stage (20 to 25 km) in which multimode excitation light is input. Since the reflection layer 14 does not have to be formed in the entire length of the transmission distance, it is possible to achieve a reduction in the costs accompanying the forming of the reflection layer 14.

Figure 7:
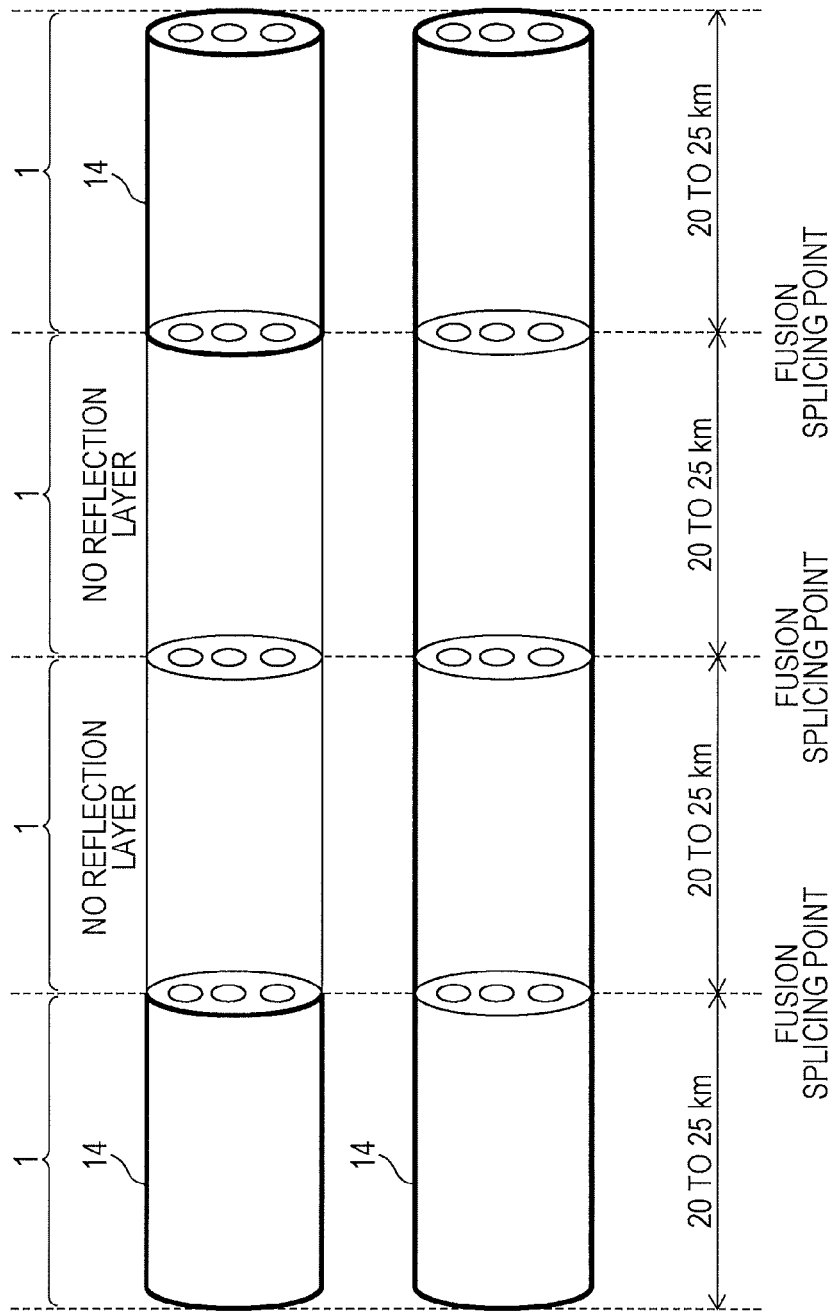
FIGS. 7A and 7B are drawings schematically depicting the way in which the reflection layer of the multicore optical fiber exemplified in FIG. 1 is formed in part or all of an optical transmission segment.

Furthermore, as schematically exemplified in FIG. 7A, the reflection layer 14 may be formed only in the multicore optical fibers 1 of the first stage and final stage that correspond to both ends of a certain optical transmission segment. Since the signal light and excitation light overlapping property may also be improved in the final stage as well as the first stage, it is possible to achieve an improvement in excitation efficiency in a segment (may be referred to as a "span") in which excitation light power is liable to decrease due to long-distance transmission.

However, if the costs permit or in order to ensure the mechanical strength of the optical transmission segment, the reflection layer 14 may be formed in all portions of the optical transmission segment as schematically exemplified in FIG. 7B.

(Example of a Method for Manufacturing the Multicore Optical Fiber 1)

Next, an example of a method for manufacturing the multicore optical fiber 1 having the aforementioned reflection layer 14 will be described.

A method in which plating or vapor deposition or the like is used (surface treatment) is a possible example of a method for forming a metal film (an invar alloy film, for example) that functions as the reflection layer 14 on the surface of the second cladding 13 that forms part of the multicore optical fiber 1. A method in which plating is used is preferable when cost performance and the like are taken into consideration.

Possible examples of plating are electroplating, vapor deposition plating, hot dipping, and chemical plating and the like. However, electroplating may be excluded from the candidates because the cladding 13 that is to be subjected to surface treatment is non-conductive.

In vapor deposition plating, it is difficult for the reflection layer 14 to be adhered to the quartz-material cladding 13 with a uniform thickness in the longitudinal direction of the multicore optical fiber 1. Furthermore, when vacuum deposition is used, a vacuum apparatus or the like has to be used and the manufacturing apparatus becomes larger, which is not preferable in terms of cost.

In hot dipping, a metal material having a low melting point such as aluminum or zinc may be used but, as previously mentioned, these normal metal materials have a considerable difference with quartz in terms of the linear expansion coefficient, and the reflection layer 14 is therefore liable to detach.

Consequently, chemical plating (may be referred to as "electroless plating") is considered to be useful for forming an invar alloy film 14 that functions as the reflection layer 14 on the quartz-material cladding 13. According to chemical plating, it is possible for the invar alloy film 14 to be precipitated onto the cladding 13 with a uniform thickness in the longitudinal direction of the multicore optical fiber 1.

Figure 8:
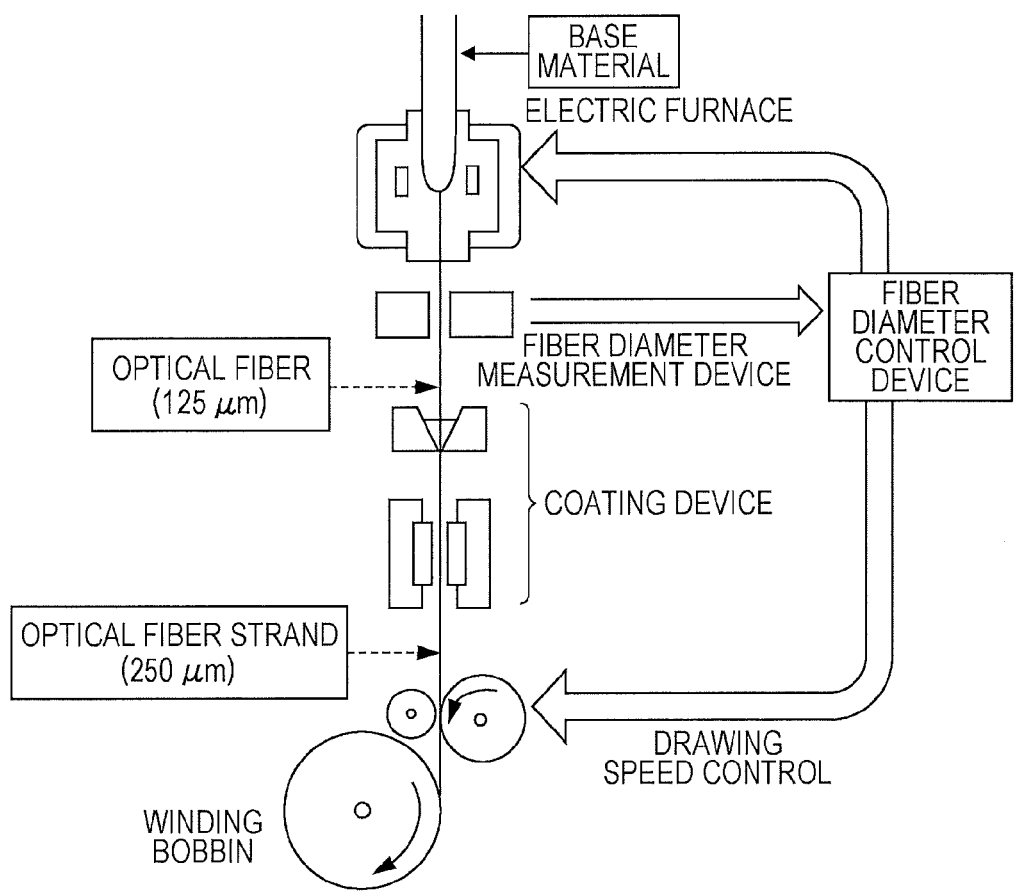
FIG. 8 is a drawing illustrating an example of a method for manufacturing the multicore optical fiber exemplified in FIG. 1.

It is possible for a chemical plating process to be easily incorporated into a known optical fiber manufacturing process. As depicted in FIG. 8, for example, a quartz glass rod is "drawn" to thereby manufacture an optical fiber, the quartz glass rod being a base material (may be referred to as a "preform") and having an external diameter of the order of several millimeters to several tens of millimeters and a length of the order of 30 to 100 cm.

In the "drawing" process, for example, the base material is placed in an electric furnace and heated (approximately 2000° C., for example), the base material melts due to the heating and is dropped or extended, and the base material is wound by a winding bobbin or the like in such a way as to have a prescribed diameter (125 μm, for example) as an optical fiber.

The external radius of the base material melted and extended from the electric furnace may be measured with a fiber diameter measurement device. A fiber diameter control device may control the temperature of the electric furnace and the winding speed of the winding bobbin in accordance with measurement results obtained by the fiber diameter measurement device. It is thereby possible for the optical fiber diameter to be controlled to a target value.

Coating treatment by a coating device may be included in the "drawing" process. For example, in the process in which the melted base material is wound by the winding bobbin, the coating device may coat the base material that is being wound with a silicon resin or the like (may be referred to as "resin finishing") in order to suppress deterioration in strength as an optical fiber. The optical fiber diameter after coating is not particularly restricted and may be of the order of 250 μm, for example. Note that the optical fiber diameter after coating may be referred to as an "optical fiber strand".

Figure 9:
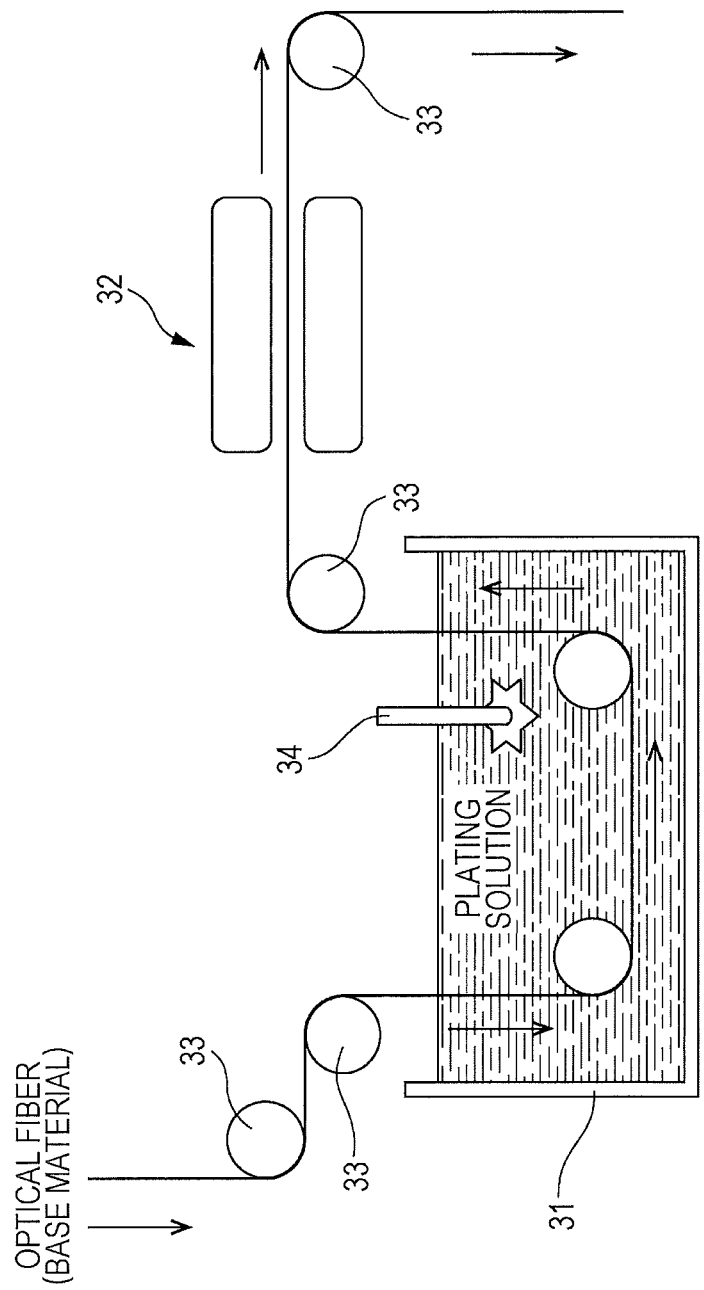
FIG. 9 is a schematic drawing depicting an example of a method for forming the reflection layer of the multicore optical fiber exemplified in FIG. 1.

The chemical plating process previously mentioned may be introduced between the aforementioned fiber diameter measurement device and the coating device, for example. In the chemical plating process, as schematically depicted in FIG. 9, for example, prior to the coating treatment, an optical fiber that is "drawn" and wound onto the winding bobbin is dipped for a suitable time in a plating solution tub 31 that is filled with an invar alloy plating solution. Note that the plating solution may be "stirred" as appropriate by an agitator 34.

After having passed through the plating solution tub 31 along a guide 33 such as a guide roller, the optical fiber passes through a heater section 32. The heater section 32 heats the base material to which the plating solution is adhered at a temperature of the order of 400 to 800° C., for example. Thus, the invar alloy plating layer composition is able to be made uniform and H2 groups are able to be removed.

Note that the "heating" time may be determined depending on the heating temperature and the amount of plating to be adhered to the optical fiber and so forth. Furthermore, the "heating" for the optical fiber may be carried out before the optical fiber is wound onto the winding bobbin as described above, or may be alternatively or additionally carried out with the optical fiber having been wound onto the winding bobbin.

For example, the optical fiber to which the plating solution is adhered may be wound by a winding bobbin having high heat resistance that is able to sufficiently withstand the heating temperature, and the optical fiber may be heated together with the winding bobbin. In a case where the optical fiber is to be produced as a product and distributed together with the winding bobbin as a unit, it would be convenient if the optical fiber could be heated with the winding bobbin as a unit.

As exemplified in FIG. 8, an optical fiber that has passed through the heater section 32 is subjected to resin finishing or the like by a coating device as desired, and is then wound onto the winding bobbin or the like. In this way, it is relatively easy for the invar alloy chemical plating process to be introduced to the "drawing" process.

In the "drawing" process, the invar alloy film 14 may be coated onto the optical fiber while the optical fiber is moved, and it is therefore easy to manufacture the multicore optical fiber 1 having the invar alloy film 14 even if the fiber length thereof is long as in an optical transmission path.

(Example of a Distributed Raman Optical Amplifier in which the Multicore Optical Fiber 1 is Used)

Figure 10:
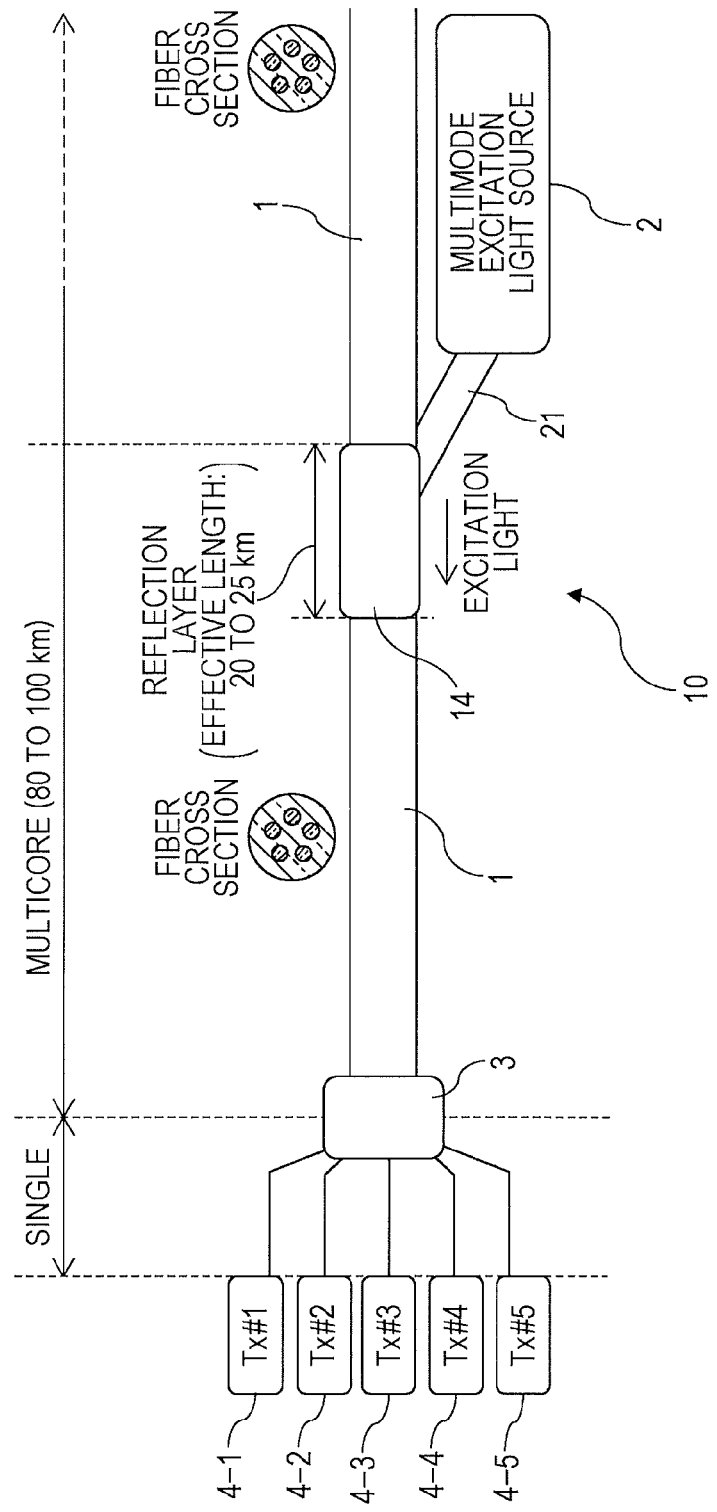
FIG. 10 is a schematic drawing depicting a configuration example of a distributed Raman amplifier in which the multicore optical fiber exemplified in FIG. 1 is used in an optical transmission/amplification medium.

FIG. 10 depicts a configuration example of a distributed Raman optical amplifier in which the aforementioned multicore optical fiber 1 is used in an optical transmission/amplification medium.

The distributed Raman optical amplifier 10 depicted in FIG. 10 is provided with, for example, the multicore optical fiber 1 that has the aforementioned invar alloy film 14 for a reflection layer, and a multimode excitation light source 2 that generates multimode excitation light to be introduced to the multicore optical fiber 1.

The invar alloy film 14 of the multicore optical fiber 1 may be formed in a length (approximately 20 km to 25 km, for example) corresponding to the effective length of the distributed Raman amplification as previously mentioned, or may be formed in a different portion.

A core coupler 3 may be disposed at one end of the multicore optical fiber 1, for example. The core coupler 3 optically couples (may be referred to as "connects"), respectively, each core 11 of the multicore optical fiber (see FIG. 1) and the output of a plurality of optical transmitters 4-1 to 4-N (N being an integer of 2 or more and representing the multicore number) that correspond to each core 11.

In the example of FIG. 10, the multicore number N=5, and the transmission light beams output from five optical transmitters 4-1 to 4-5 are separately coupled and introduced to the corresponding cores 11, respectively, by the core coupler 3. The transmission light beams may be single-mode signal light or may be multimode signal light. The transmission light beams coupled and introduced to the cores 11 propagate toward the other end of the multicore optical fiber 1 (in the rightward direction of the page of FIG. 10).

The multimode excitation light source 2 may be optically connected to the multicore optical fiber 1 by an excitation light introducing structure 21, for example. The excitation light introducing structure 21 couples and introduces multimode excitation light that is output from the multimode excitation light source 2, to the region (excitation light introduction region) inside the invar alloy film 14 of the multicore optical fiber 1.

In other words, the multimode excitation light beams do not have to be separately introduced to the cores 11 through which signal light propagates, and may be introduced all at once to the region inside the invar alloy film 14. Thus, the signal light beams that propagate through each core 11 may be amplified all at once by the multimode excitation light.

Consequently, it is possible for the excitation light introducing structure 21 to be simplified compared with a structure in which single-mode signal light beams that propagate through multiple cores are separately excited by single-mode excitation light. As a comparative example, FIG. 11 depicts an example of a structure in which single-mode signal light beams that propagate through multiple cores are separately excited by single-mode excitation light.

Figure 11:
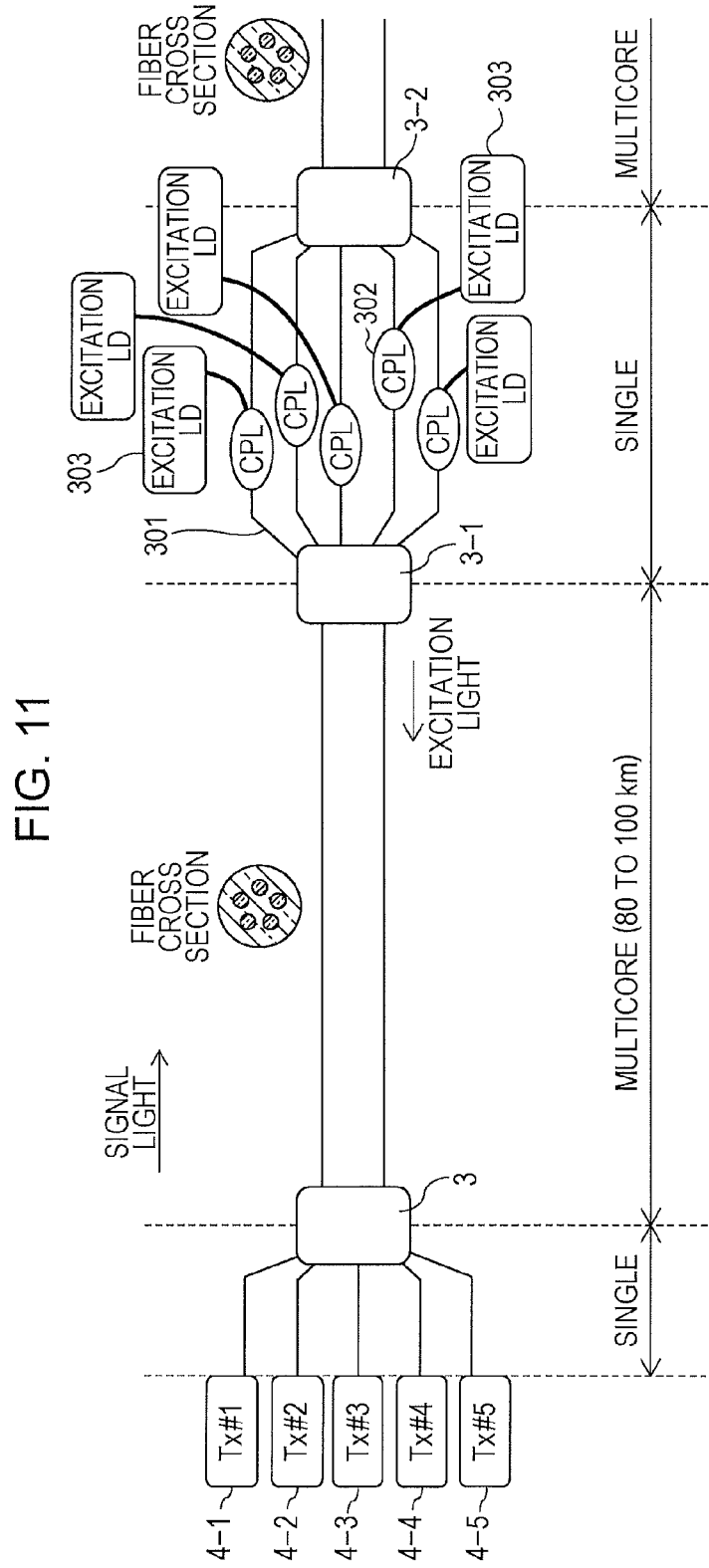
FIG. 11 is a schematic drawing depicting an example of a structure that separately introduces single-mode excitation light into the cores of a multicore optical fiber.

FIG. 11 depicts an example in which the multicore number N=5, and two core couplers 3-1 and 3-2 that are the same as the core coupler 3 of FIG. 10 are used to separately introduce single-mode excitation light beams to five cores of a multicore optical fiber, for example.

In other words, each core of one multicore optical fiber is optically coupled to one end of a separate optical fiber 301 by one core coupler 3-1, and the other end of each optical fiber 301 is optically coupled to a core of the other multicore optical fiber by the other core coupler 3-2. The cores of the multicore optical fibers are thereby individually separated by the optical fibers 301 and drawn out to outside the multicore optical fibers.

Multiplexing couplers (CPL) 302 or the like are used to couple excitation light sources (LDs, for example) 303 that output single-mode excitation light, to each of the optical fibers (hereinafter, sometimes referred to as "core-coupling fibers") 301 between the core couplers 3-1 and 3-2.

Figure 12:
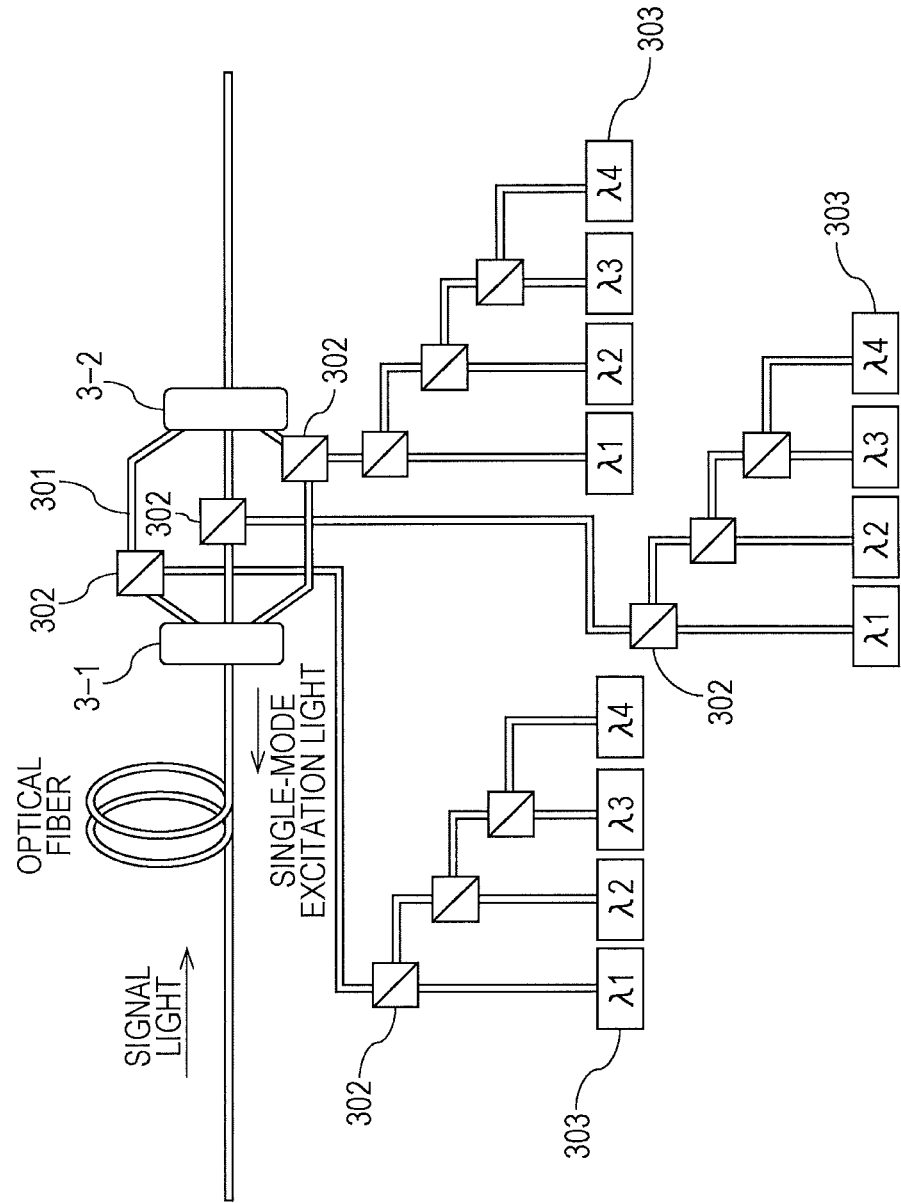
FIG. 12 is a schematic drawing depicting an example of a structure that separately introduces single-mode excitation light into the cores of a multicore optical fiber.

If the number of wavelengths of the excitation light introduced to each core-coupling fiber 301 between the core couplers 3-1 and 3-2 is increased, excitation light sources 303 of a number corresponding to the number of wavelengths are optically coupled to the core-coupling fibers 301, as exemplified in FIG. 12.

Excitation light of a plurality of wavelengths is multiplexed by the multiplexing couplers 302 or the like and coupled to the core-coupling fibers 301, for example. Note that FIG. 12 depicts an example in which the multicore number N=3 and the number of wavelengths of the excitation light introduced to each core-coupling fiber 301 is four wavelengths of $\lambda 1$ to $\lambda 4$.

In this way, the core couplers 3-1 and 3-2 and the core-coupling fibers 301 are used for it to be possible to separately introduce single-mode excitation light to each core of a multicore optical fiber; however, the excitation light introducing structure becomes complex. The excitation light introducing structure becomes even more complex as the multicore number N and the number of wavelengths of the excitation light are increased. Therefore, there is concern that the distributed Raman amplifier may increase in size and power consumption may also increase.

In contrast to this, the excitation light introducing structure 21 of the present embodiment is able to introduce multimode excitation light to the region inside the reflection layer 14 of the multicore optical fiber 1, and therefore the core couplers 3-1 and 3-2 do not have to be used and each core 11 does not have to be separated with separate core-coupling fibers 301.

Figure 13:
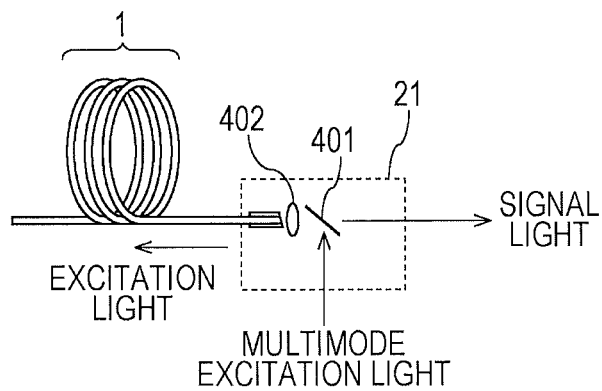
FIG. 13 is a schematic drawing depicting an end pumping structure serving as an example of a structure that introduces multimode excitation light into the multicore optical fiber exemplified in FIG. 1.
Figure 14:
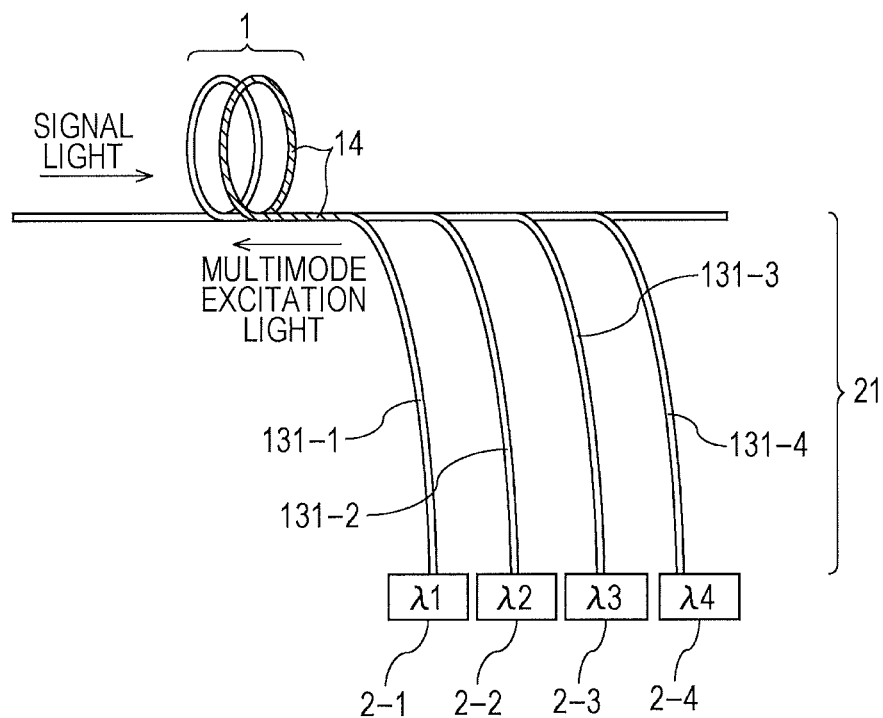
FIG. 14 is a schematic drawing depicting a side pumping structure serving as an example of a structure that introduces multimode excitation light into the multicore optical fiber exemplified in FIG. 1.

Therefore, in the excitation light introducing structure 21, it is possible to apply a simple structure such as an "end pumping" structure such as that exemplified in FIG. 13 or a "side pumping" structure such as that exemplified in FIG. 14, for example.

In an end pumping structure, multimode excitation light is coupled and introduced from a direction parallel to the axial direction of the multicore optical fiber 1 to the region inside the reflection layer 14 of an end surface of the multicore optical fiber 1.

For example, in the structure of FIG. 13, multimode excitation light is reflected by a mirror 401 in the axial direction of the multicore optical fiber 1 and is collected by a light collection lens 402 and input to the end surface of the multicore optical fiber 1.

Note that the multimode excitation light may be output light from a multimode excitation light source of one wavelength, and may be wavelength-multiplexed multimode excitation light obtained by the outputs of multimode excitation light sources corresponding to each of a plurality of wavelengths having been wavelength-multiplexed by a multiplexing coupler or the like.

On the other hand, in a side pumping structure, the previously mentioned mirror and light collection lens do not have to be used, and multimode excitation light is coupled and introduced from a side surface of a multicore optical fiber 1 to the region inside the reflection layer 14 of the multicore optical fiber 1, for example.

Figure 15:
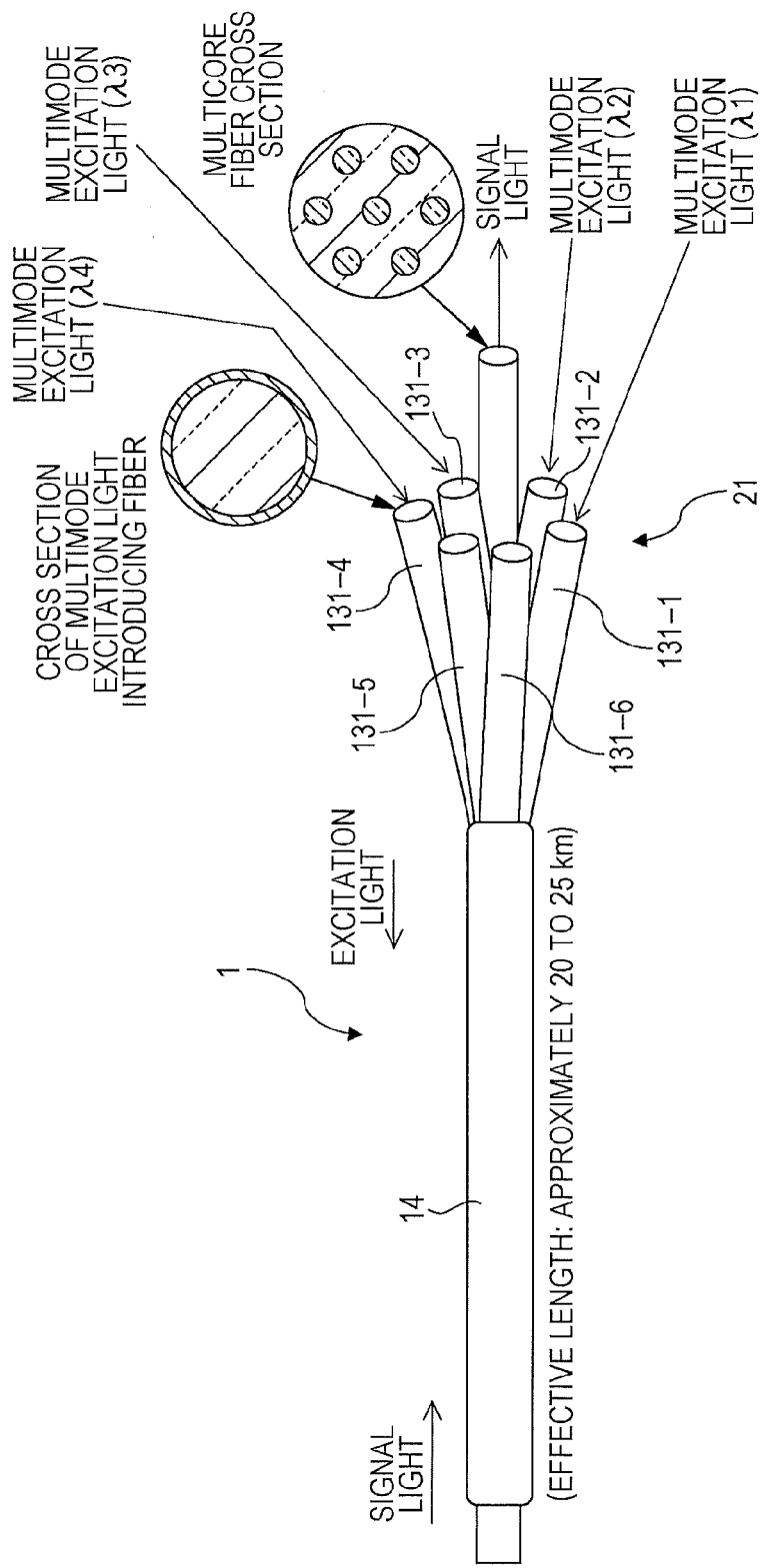
FIG. 15 is a schematic drawing depicting a structural example of a multicore optical fiber with which the side pumping structure exemplified in FIG. 14 is able to be realized.

As schematically depicted in FIG. 14 and FIG. 15, for example, multimode excitation light guide sections (sometimes also simply referred to as "guide sections") 131-1 to 131-M for introducing multimode excitation light to the region inside the reflection layer 14 may be disposed in the multicore optical fiber 1.

M is a natural number and corresponds to the number of wavelengths of the multimode excitation light introduced to the multicore optical fiber 1, for example. Reference is sometimes made to a "guide section 131" when a distinction does not have to be made between the guide sections 131-1 to 131-M. The guide section 131 may be referred to as an "introduction fiber 131".

FIG. 15 exemplifies a case where M=6 and exemplifies a mode in which it is possible for multimode excitation light of four wavelengths ($\lambda 1$ to $\lambda 4$) to be introduced into the multicore optical fiber 1 by four guide sections 131-1 to 131-4 from among six guide sections 131-1 to 131-6.

Focusing on the relationship between FIG. 14 and FIG. 15, multimode excitation light sources 2-1 to 2-4 of the four wavelengths $\lambda 1$ to $\lambda 4$ exemplified in FIG. 14 may be treated as being optically coupled to the four guide sections 131-1 to 131-4, respectively.

Figure 16:
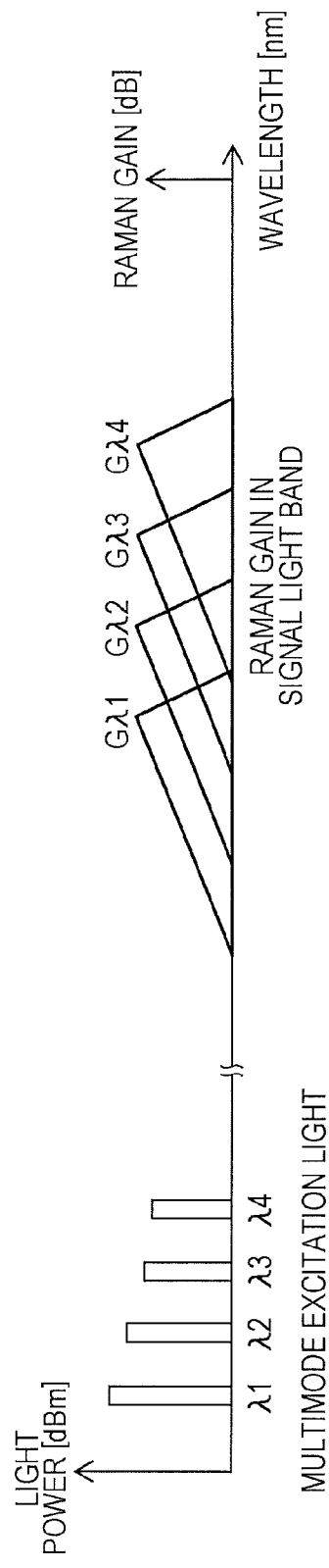
FIG. 16 is a drawing depicting an example of Raman gain obtained by introducing multimode excitation light of a plurality of wavelengths into the multicore optical fiber exemplified in FIG. 1.

Note that FIG. 16 schematically depicts an example of the relationship between the light power of the multimode excitation light beams to $\lambda 4$ of the four wavelengths, and Raman gains $G\lambda 1$ to $G\lambda 4$ obtained in a signal light band by the multimode excitation light beams.

As exemplified in FIG. 14 and FIG. 15, according to the side pumping structure, changes in the number of wavelengths of multimode excitation light may be easily accommodated by changing the number of multimode excitation light guide sections 131.

Consequently, it is possible to flexibly and easily accommodate even system upgrades such as enlarging the Raman amplification band and increasing the Raman gain.

Figure 17:
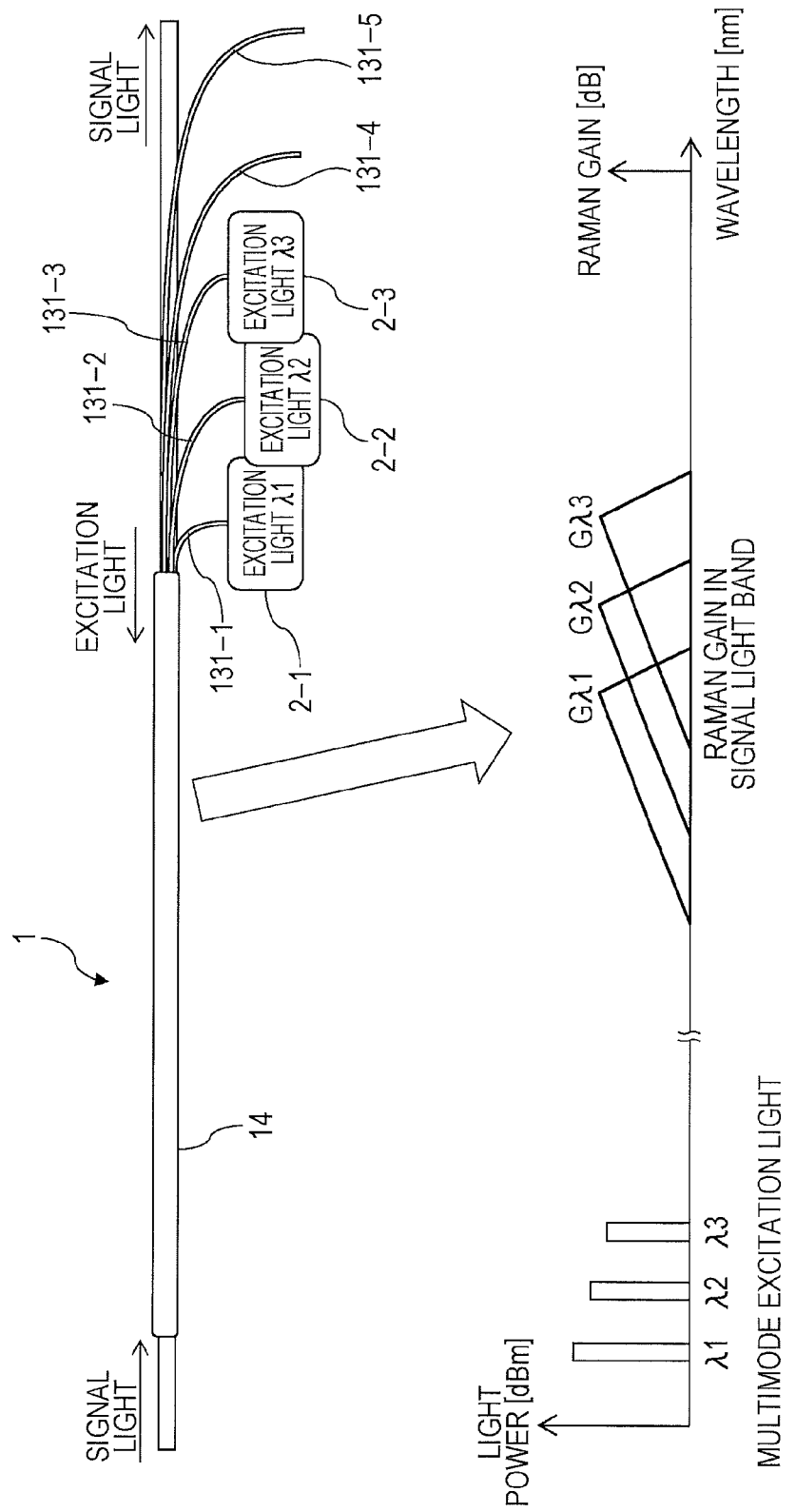
FIG. 17 is a drawing illustrating a mode in which multimode excitation light of three wavelengths is introduced into the multicore optical fiber exemplified in FIG. 15 as an example of the initial introduction of light.

As schematically depicted in FIG. 17, for example, guide sections 131-1 to 131-5 corresponding to the maximum number of excitation wavelengths envisaged (five wavelengths, for instance) may be formed in the multicore optical fiber 1 in advance. Then, multimode excitation light sources 2-1 to 2-3 are connected to guide sections 131-1 to 131-3 of a portion of the optical transmission system (a portion for three wavelengths, for example) when light is initially introduced to the optical transmission system.

Figure 18:
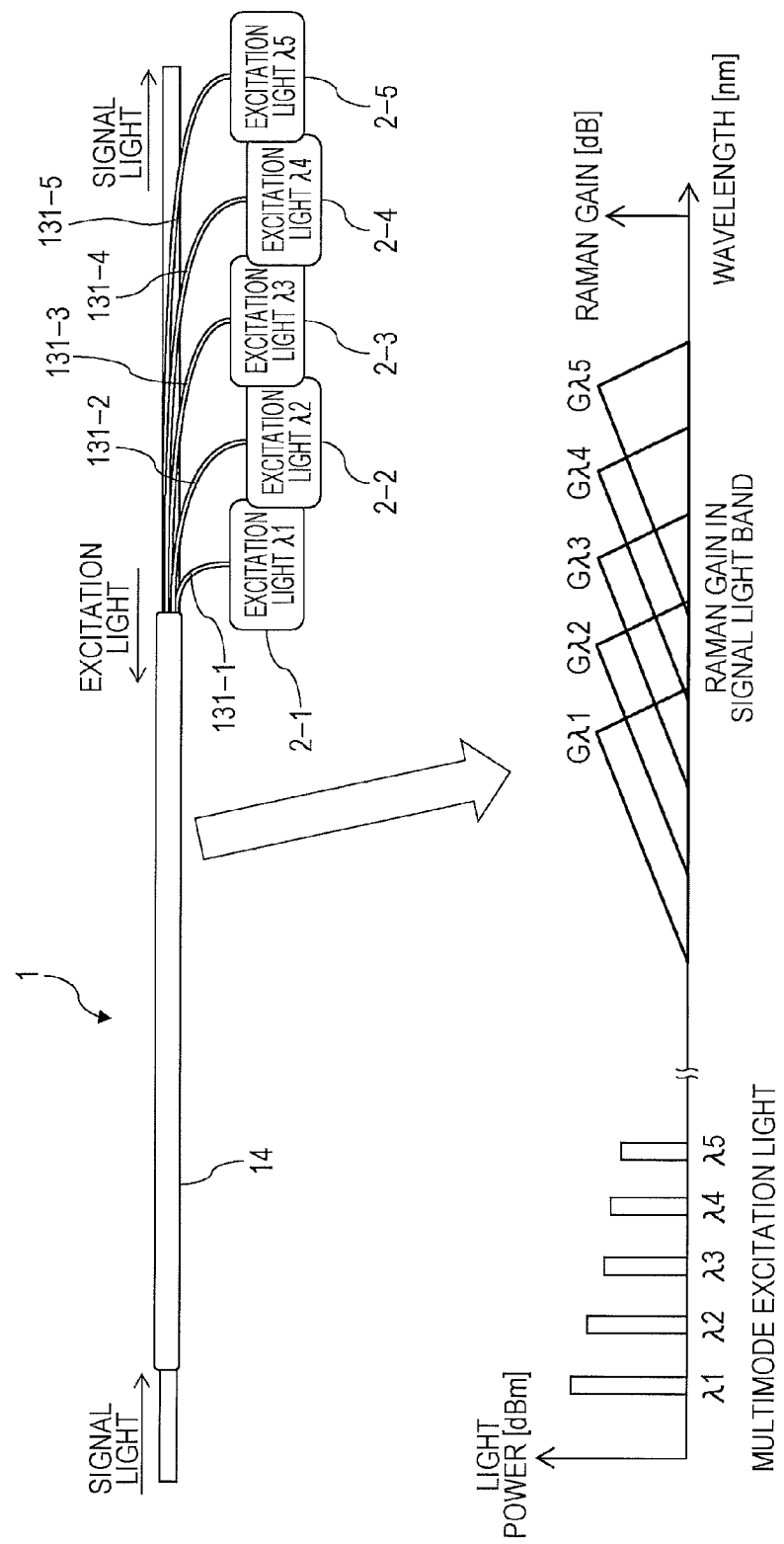
FIG. 18 is a drawing illustrating a mode in which multimode excitation light of two wavelengths is additionally introduced due to an upgrade to the example of the initial introduction of light exemplified in FIG. 17.

Thereafter, as schematically depicted in FIG. 18, for example, if the addition of multimode excitation light sources 2-4 and 2-5 for two wavelengths ($\lambda 4$ and $\lambda 5$) is desirable due to a system upgrade, the excitation light sources 2-4 and 2-5 may be connected to the available guide sections 131-4 and 131-5.

In this way, it is possible to flexibly and easily accommodate changes to and expansion of the number of wavelengths of multimode excitation light introduced to the multicore optical fiber 1, and a highly flexible and expandable optical transmission system is therefore able to be realized and provided. Furthermore, since the desired number of excitation light sources 2 may be connected to the guide section 131 as appropriate, seamless changes and expansions are possible even during operation of the optical transmission system.

Figure 19:
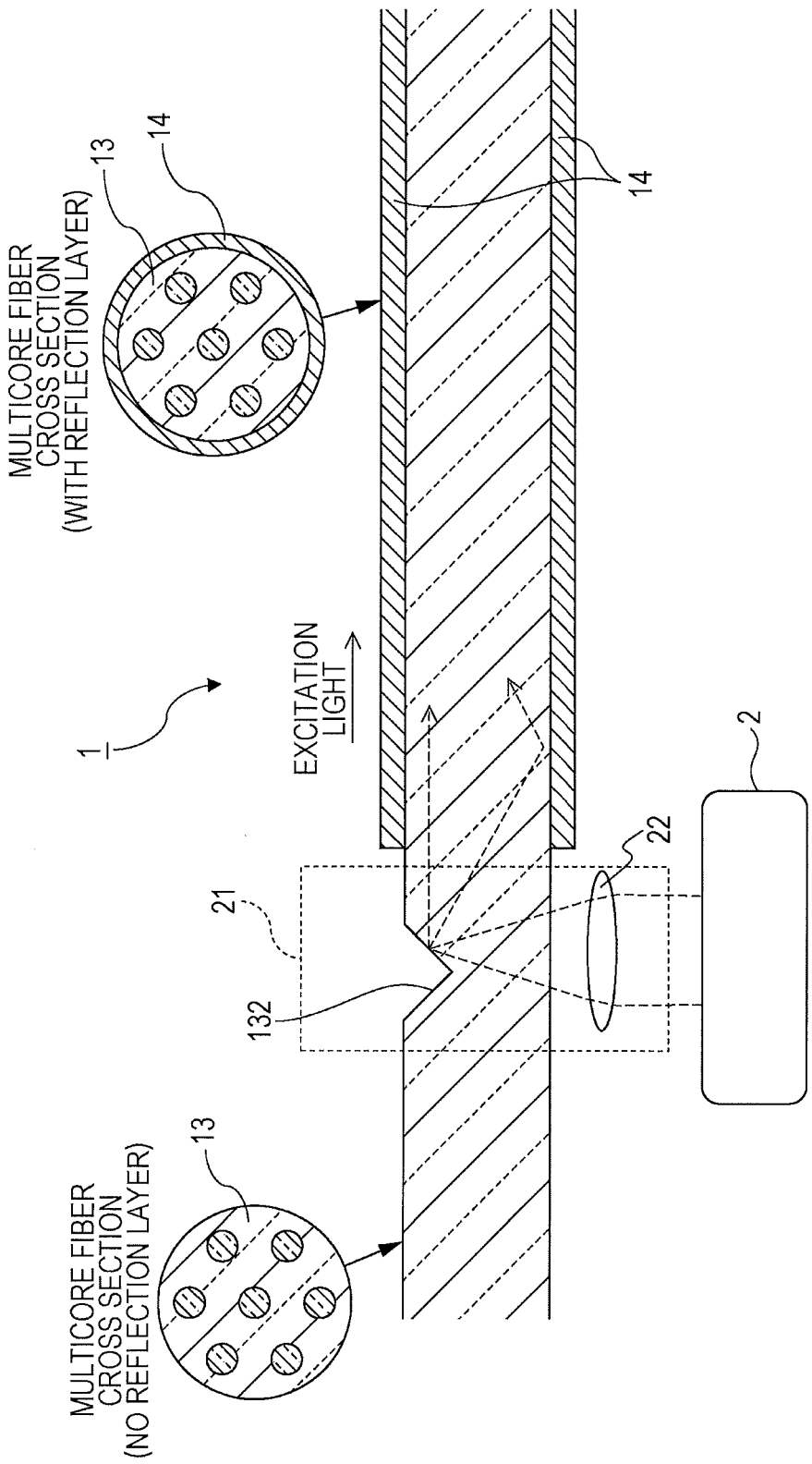
FIG. 19 is a schematic drawing depicting a modified example of the side pumping structure exemplified in FIG. 14.

Note that a structure such as that depicted in FIG. 19, for example, may be applied in the excitation light introducing structure 21 as a modified example of a side pumping structure. The excitation light introducing structure 21 depicted in FIG. 19 is, for example, provided with a light collection lens 22 that collects multimode excitation light.

The light collection lens 22, for example, is arranged in such a way that multimode excitation light is collected at one inclined surface of a V-shaped groove (V-groove) 132 formed in the second cladding 13 of the multicore optical fiber 1. Consequently, multimode excitation light reflected by the inclined surface is introduced and propagated in the longitudinal direction of the multicore optical fiber 1.

At such time, since multimode excitation light that has become radiation mode light is repeatedly reflected by the reflection layer 14 to be propagated in the longitudinal direction of the multicore optical fiber 1 as previously mentioned, the power distribution of the multimode excitation light is made uniform and the property of overlapping with signal light is improved.

Since it is possible for multimode excitation light beams to be introduced all at once to the region inside the reflection layer 14 of the multicore optical fiber 1 as previously mentioned, an excitation light introducing structure 21 having a simple structure may be applied. Consequently, distributed Raman amplification technology is able to be easily applied to multicore transmission with which an expansion in optical transmission capacity is able to be achieved. Furthermore, it is possible to achieve a reduction in power consumption and the scale and cost of the distributed Raman optical amplifier 10 applied in the multicore transmission.

Note that, in the aforementioned examples, although an example has been described in which a multicore optical fiber 1 having a reflection layer 14 formed therein is applied in a distributed Raman optical amplifier 10, the multicore optical fiber 1 may be applied in an optical amplification medium of a concentrated Raman amplifier.

A multicore optical fiber 1 used for an optical amplification medium of a concentrated Raman amplifier may be a highly non-linear optical fiber having multiple cores. It is possible for the same operations and effects as with the distributed Raman optical amplifier 10 to be exhibited even when the multicore optical fiber 1 is used for an optical amplification medium of a concentrated Raman amplifier.

(Structural Example of a Multimode Excitation Light Source)

Next, a structural example of a multimode excitation light source 2 will be described with reference to FIG. 20 and FIG. 21. As exemplified in FIG. 20, the multimode excitation light source 2 may be configured as a semiconductor laser diode (LD) chip capable of emitting light from each of a plurality of active layers, for example.

The semiconductor LD chip 2 is, for example, provided with a plurality (three in the example of FIG. 20) of stripe-shaped active layers (hereinafter sometimes referred to as "stripe active layers") 211, and a cladding layer 212 that forms a double heterojunction with respect to each stripe active layer 211.

For example, at one surface of the cladding layer 212 in which the stripe active layers 211 are inserted, stripe electrodes (anodes or cathodes) 213 are disposed corresponding to the stripe active layers 211, in the longitudinal direction of the stripe active layers 211. For example, a ground (GND) electrode 214 is disposed at the other surface of the cladding layer 212 located at the opposite side of the surface on which the stripe electrodes 213 are disposed.

When a voltage is applied by a power source 215 and a driver circuit 216 and a current of a prescribed value or more flows in the stripe electrodes 213, electrons and positive holes couple in the corresponding stripe active layers 211 such that induced emission occurs and light is emitted.

End surfaces where the stripe active layers 211 are exposed are referred to as cleaved surfaces, and opposing cleaved surfaces function as reflection mirrors of a Fabry-Perot optical resonator. Consequently, light that is emitted at the stripe active layers 211 travels back and forth between the cleaved surfaces due to being reflected and is thereby amplified and emitted.

When a voltage is applied to each of the stripe electrodes 213, light is emitted from each of the stripe active layers 211. The semiconductor LD chip 2 having a structure such as this may be referred to as a "multistripe excitation light source 2".

Figure 21:
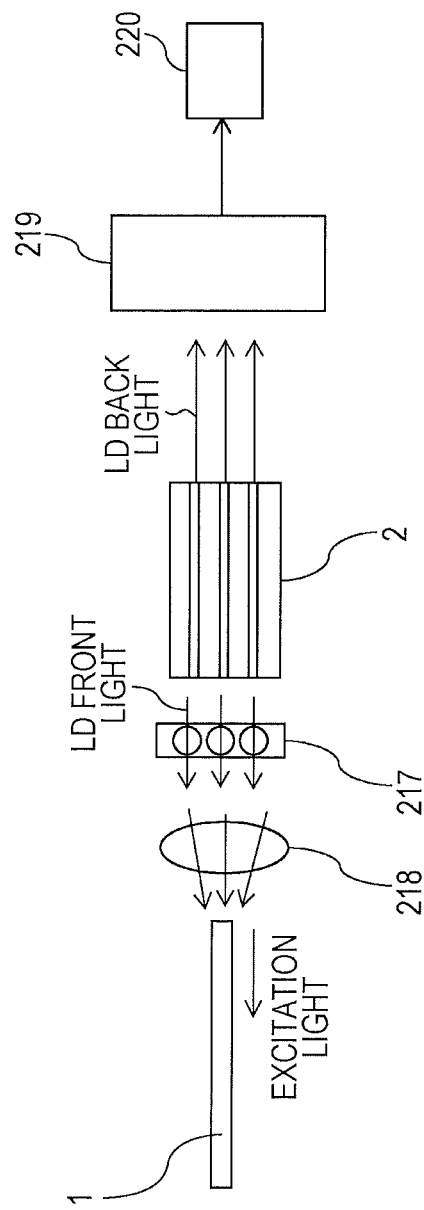
FIG. 21 is a schematic drawing depicting an example of a structure that uses the multistripe excitation light source exemplified in FIG. 20 to introduce multimode excitation light into the multicore optical fiber exemplified in FIG. 1.

Light that is emitted through one cleaved surface from the stripe active layers 211 of the multistripe excitation light source 2 (referred to as "LD front light" for convenience) is collected using a microlens array 217 and a light collection lens 218 as schematically depicted in FIG. 21, for example. Thus, high-output power multimode light corresponding to the number of stripe active layers 211 is obtained with one semiconductor LD chip 2.

As a result of the multimode light being coupled in the region inside the reflection layer 14 of the multicore optical fiber 1 as previously mentioned as excitation light for distributed Raman amplification, high-output power multimode excitation light is able to be introduced to the multicore optical fiber 1.

The region inside the reflection layer 14 of the multicore optical fiber 1 has a larger diameter than the core diameters of the individual cores 11. Therefore, it is easy to efficiently couple multimode excitation light from afar when compared with coupling single-mode excitation light to individual cores 11.

Furthermore, compared with using a plurality of individual semiconductor LDs to increase the output of the excitation light power, the light collection structure is able to be simplified and, consequently, precise alignment work for the individual semiconductor LDs may be rendered superfluous.

Note that, as schematically exemplified in FIG. 21, light emitted by the stripe active layers 211 may also be emitted from the other cleaved surface of the semiconductor LD chip 2 at the opposite side to the cleaved surface from which the LD front light is emitted. This light may be referred to as "LD back light" in contrast to the previously mentioned "LD front light".

The LD back light may be treated as having the same output light power as the LD front light. Consequently, for example, the power of the LD front light may be controlled by monitoring the power of the LD back light and feedback-controlling the driver circuit based on that monitored power.

As depicted in FIG. 21, this monitoring may be realized using an optical receiver 219 and an electric circuit 220 for feedback control, for example. For example, the optical receiver 219 may be a photodetector or a photodiode (PD) that receives the LD back light and outputs an electrical signal (current, for example) corresponding to that received power, for example.

The electric circuit 220 may include a transimpedance amplifier (TIA) that converts the output current of the PD 219 into a voltage. By controlling the voltage applied to the stripe electrodes 213 from the driver circuit 216 exemplified in FIG. 20 in accordance with the output voltage of the TIA, it becomes possible to control the output light power of the multistripe excitation light source 2.

(Application of the Reflection Layer 14 in a Rare Earth-Added Optical Fiber)

Figure 22:
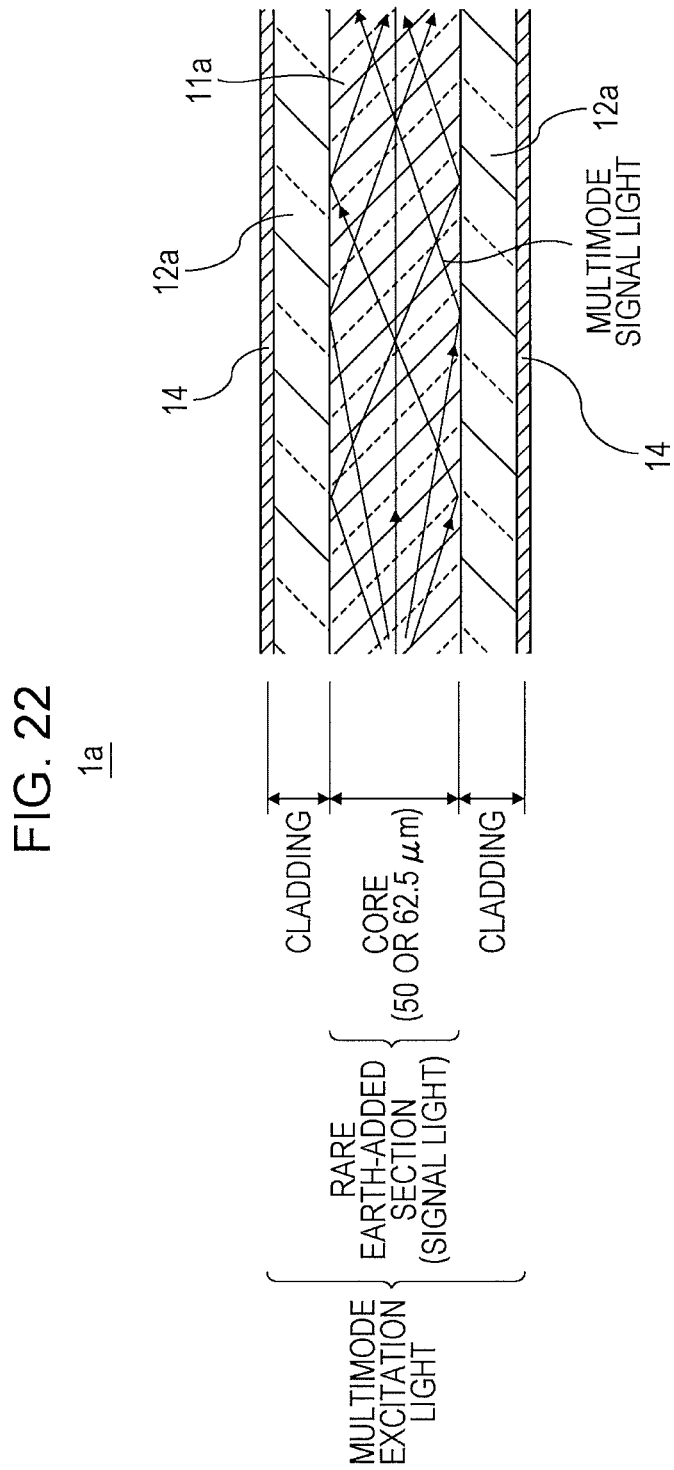
FIG. 22 is a schematic side cross-sectional drawing of a rare earth-added optical fiber in which the reflection layer exemplified in FIG. 1 is formed.

Note that the reflection layer 14 applied in the aforementioned multicore optical fiber 1 may also be applied in a rare earth-added optical fiber 1a in which a rare earth (erbium, for example) is added to a core, an example of which is depicted in FIG. 22. FIG. 22 is a schematic side cross-sectional drawing of the rare earth-added optical fiber 1a.

As exemplified in FIG. 22, the rare earth-added optical fiber 1a is provided with a core 11a to which a rare earth such as erbium has been added, and a cladding 12a that covers the outer periphery of the core 11a. The previously mentioned reflection layer 14 may be formed at the outer periphery of the cladding 12a. Note that although the rare earth-added optical fiber is exemplified in FIG. 22 is a single-core fiber, a multi-core optical fiber having a plurality of cores 11a is also permissible.

Signal light that propagates through the core 11a may be multimode light (see FIG. 22) or may be single-mode light. When excitation light of multimode light is introduced to the rare earth-added optical fiber ha, the signal light that propagates through the core 11a is able to be amplified by the multimode excitation light.

Note that the propagation direction of the multimode excitation light may be the same direction as the propagation direction of the signal light or may be the opposite direction. A case where the propagation directions are the same corresponds to "forward excitation", and a case where the propagation directions are opposite to each another corresponds to "backward excitation".

Similar to the previously mentioned multicore optical fiber 1, multimode excitation light is guided in the axial direction of the rare earth-added optical fiber is while a portion of the light that has become radiation mode light is repeatedly reflected and vertically blocked in the radial direction by the reflection layer 14.

Figure 23:
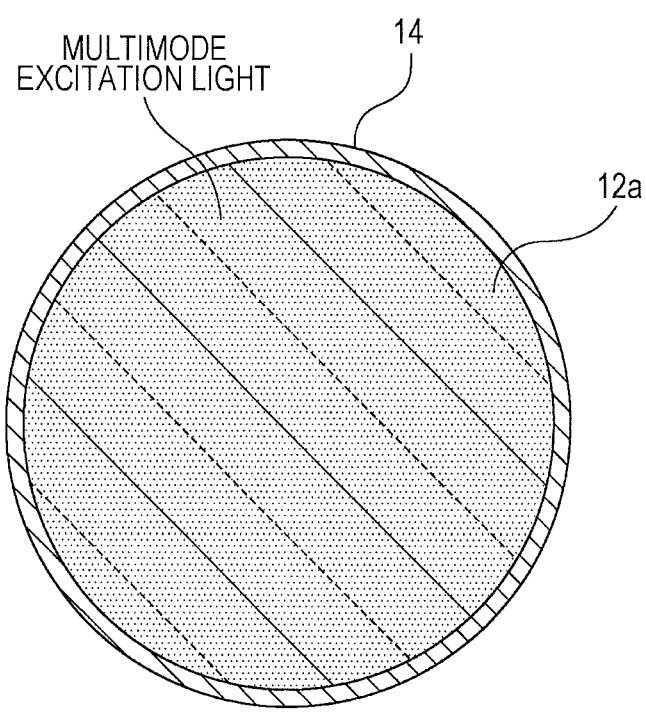
FIG. 23 is a schematic cross-sectional drawing depicting the way in which multimode light propagates through the entire region inside the reflection layer of the rare earth-added optical fiber exemplified in FIG. 22.

Consequently, similar to the previously mentioned multi-core optical fiber 1, in the rare earth-added optical fiber 1a, multimode excitation light is guided through the entire region inside the reflection layer 14 while being vertically blocked, and it therefore becomes easy for the excitation light power to be uniformly distributed across the entire region (see FIG. 23).

The greater the region in which the signal light and the excitation light overlap in the rare earth-added optical fiber 1a, the more the excitation efficiency of the signal light that propagates through the core improves. Consequently, by making the distribution of excitation light power uniform in the radial direction of the rare earth-added optical fiber 1a, it becomes possible to enlarge the overlapping region and improve the excitation efficiency of the signal light. The optical amplification efficiency also improves as a result of the excitation efficiency improving.

FIG. 24 depicts a configuration example of a rare earth-added optical fiber amplifier 10a in which the aforementioned rare earth-added optical fiber is is used in an amplification medium. The rare earth-added optical fiber amplifier 10a depicted in FIG. 24 is provided with the rare earth-added optical fiber is having the aforementioned reflection layer 14 formed therein, and a multimode excitation light source 2, for example.

Figure 20:
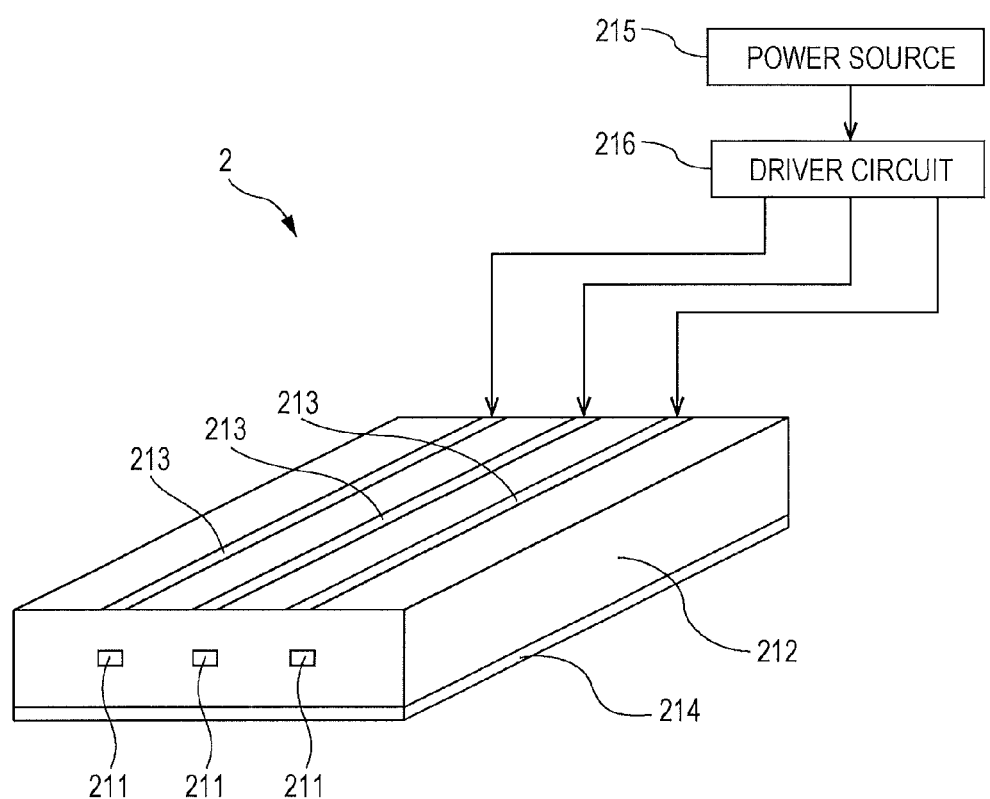
FIG. 20 is a schematic drawing depicting a configuration example of a multimode excitation light source (multistripe excitation light source) that generates multimode excitation light that is introduced into the multicore optical fiber exemplified in FIG. 1.

There are no particular restrictions with regard to the multimode excitation light source 2 applied in the rare earth-added optical fiber amplifier 10a and, for example, a multistripe excitation light source 2 such as that depicted in FIG. 20 and FIG. 21 may be applied.

For example, the multimode excitation light source 2 may introduce multimode excitation light to the rare earth-added optical fiber 1a in the same direction as the propagation direction (in the rightward direction in the example of FIG. 24) of signal light that propagates through the rare earth-added optical fiber 1a. Consequently, in the example of FIG. 24, the signal light is forward-excited by the multimode excitation light.

Isolators 311 and 312 that stop the signal light returning in the opposite direction are respectively provided at the signal light input and output sides of the rare earth-added optical fiber 1a. Due to the isolators 311 and 312, it is possible to avoid an oscillation phenomena occurring in the rare earth-added optical fiber 1a.

Amplification gain by the rare earth-added optical fiber 1a is able to be controlled by controlling the output light power (may be referred to as "multimode excitation light power") of the multimode excitation light source. For example, the control of amplification gain may be carried out based on a monitoring result regarding the input/output light power of the rare earth-added optical fiber 1a.

In the example FIG. 24, the monitoring point for input signal light power to the rare earth-added optical fiber 1a is set at the input side of one isolator 311, and the monitoring point for output signal light power of the rare earth-added optical fiber is is set at the output side of the other isolator 312.

In other words, the input signal light is branched at a branching coupler 313 disposed in the input-side optical transmission path of the one isolator 311, and the branched light is received by an optical receiver 314. Furthermore, the output signal light is branched at a branching coupler 315 disposed in the output-side optical transmission path of the other isolator 312, and the branched light is received by an optical receiver 316.

The branching coupler 313 corresponding to the input monitoring point and the one isolator 311 may be switched with each other in terms of their arrangement relationship. Furthermore, the other isolator 312 and the branching coupler 315 corresponding to the output monitoring point may be switched with each other in terms of their arrangement relationship.

The optical receivers 314 and 316 may both be PDs, and output an electrical signal (current, for example) corresponding to received power to a control circuit 317. Note that an optical filter 318 that cuts optical noise components such as spontaneous emission light may be disposed at the output side (the stage before the isolator 312, for example) of the rare earth-added optical fiber 1a.

The control circuit 317 is able to control the output light power level of the multimode excitation light source 2 in accordance with input/output light power information of the rare earth-added optical fiber is indicated by input electrical signals from the optical receivers 314 and 315. It is thereby possible for the amplification gain of signal light by the rare earth-added optical fiber is to be controlled.

As described above, by using the rare earth-added optical fiber is having the reflection layer 14 formed therein in an amplification medium and introducing multimode excitation light to the optical fiber 1a, the excitation efficiency of signal light in the rare earth-added optical fiber 1a is able to be improved and amplification efficiency is able to therefore be improved.

CONCLUSION

Any of the operations and effects exemplified hereinafter are able to be exhibited as described above according to the aforementioned embodiments.

By forming a reflection layer 14 that reflects multimode light in the longitudinal direction for a length that is equal to or greater than the effective length of optical amplification, in an optical fiber that is an example of an optical amplification medium, propagation loss of the multimode light, which propagates through the region inside the reflection layer 14, is able to be reduced.

By introducing multimode excitation light to the region inside the reflection layer 14, propagation loss of the multimode excitation light are able to be reduced, and the power distribution of the multimode excitation light is able to be made uniform in the radial direction of the optical fiber. Consequently, the excitation efficiency of signal light is able to be improved. Thus, satisfactory optical amplification characteristics corresponding to a single core may be realized even with a multiple cores, for example. For example, an improvement in amplification gain and a reduction in the noise factor (NF) may be achieved, and an improvement in the optical signal-to-noise ratio (OSNR) may therefore be achieved.

Since excitation light does not have to be separately introduced to cores and excitation light beams may be introduced all at once to the region inside the reflection layer 14, which has a diameter greater than the individual cores, the structure and alignment of the excitation optical system is able to be simplified. Consequently, a reduction in cost, a reduction in size, and a reduction in power consumption and so forth may be achieved for an optical amplifier.

Since excitation light beams may be introduced all at once to the region inside the reflection layer 14, the introducing structure for the multimode excitation light is not dependent upon the multicore number. Consequently, the effects of a reduction in cost, a reduction in size, and a reduction in power consumption and so forth for an optical amplifier increase as the multicore number of each multicore optical fiber increases.

Since there is no effect on the function as an optical transmission path (not obstructed) even with an optical fiber having the reflection layer 14 formed therein, the optical fiber having the reflection layer 14 formed therein may be applied in an optical transmission segment in which distributed Raman amplification is not desirable when light is initially introduced to the optical transmission system, for example. If distributed Raman amplification is to be applied in the optical transmission segment thereafter, distributed Raman amplification having satisfactory excitation efficiency may be realized using the laid optical fiber having the reflection layer 14 as it is. Consequently, a reduction in system costs may be achieved.

By forming a metal film of an invar alloy having a linear expansion coefficient that is the same as (or close to) the linear expansion coefficient of a quartz material that is the material of the optical fiber, in the optical fiber as an example of the reflection layer 14, the detachment or separation of the reflection layer is able to be suppressed and the mechanical strength of the optical fiber may be improved. Consequently, degradation of the optical fiber due to pressure or stress is able to be avoided or suppressed.

The multicore optical fiber 1 having the reflection layer 14 formed therein may be applied in and is useful for not only an optical transmission system in which single-mode signal light is guided to each of a multiple of cores but also for an optical transmission system in which multimode signal light is guided to multiple cores to achieve a further increase in optical transmission capacity. By promoting the mode conversion of excitation light to make the signal light and excitation light overlapping property uniform, excitation efficiency is able to be dramatically improved in a system in which multimode signal light is transmitted to multiple cores. Consequently, an improvement in the OSNR and a reduction in the size of the optical amplifier may be achieved.

Note that FIG. 25 depicts an example of a list table for the application scope and application effects of an optical fiber having the previously mentioned reflection layer 14 formed therein. As exemplified in FIG. 25, the reflection layer 14 may be applied in an optical fiber serving as an amplification medium for any of a distributed Raman amplifier, a rare earth-added optical fiber amplifier, and a concentrated Raman amplifier.

Regardless of whether the amplification medium is a single-core or a multicore optical fiber, if multimode excitation light is introduced, the excitation efficiency of signal light is able to be improved by the reflection layer 14 regardless of whether single-mode or multimode signal light is propagated in a core.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A multimode optical transmission medium, comprising:
a plurality of cores;
a first cladding that covers each of the plurality of cores;
a second cladding that covers a plurality of first claddings; and
a reflection layer that covers the second cladding and has reflection characteristics with respect to a wavelength band of multimode light, the reflection layer being a metal film of one of Invar alloy or Kovar alloy.

2. The multimode optical transmission medium according to claim 1,
wherein signal light is introduced to the plurality of cores, and
multimode excitation light that is propagated in the multimode optical transmission medium is introduced to a region inside the reflection layer of the optical transmission medium.

3. The multimode optical transmission medium according to claim 2,
wherein the multimode excitation light is excitation light for distributed Raman amplification, and
the reflection layer is formed in a length corresponding to at least an effective length of the distributed Raman amplification, in a direction parallel to a direction in which the signal light propagates.

4. The multimode optical transmission medium according to claim 1,
wherein the metal film is formed using electroless plating.

5. An optical amplifier, comprising:
a multimode optical transmission medium including
a plurality of cores,
a plurality of separated first claddings, each of the first claddings covering one of the plurality of cores, and
a second cladding that covers the plurality of first claddings;
a reflection layer that covers the second cladding and has reflection characteristics with respect to a wavelength band of multimode light;
a multimode excitation light source that outputs multimode excitation light that is propagated in the multimode optical transmission medium; and
an excitation light introducing structure introduces the multimode excitation light that is output from the multimode excitation light source, to the plurality of separated first claddings and the second cladding inside the reflection layer of the multimode optical transmission medium.

6. The optical amplifier according to claim 5,
wherein the excitation light introducing structure includes a plurality of excitation light introducing sections that introduce the multimode excitation light to the region inside the reflection layer of the multimode optical transmission medium, and
the multimode excitation light source is connected to some or all of the plurality of excitation light introducing sections.

7. The optical amplifier according to claim 5,
wherein the reflection layer is a metal film of an invar alloy that is an alloy of nickel and iron.

8. The optical amplifier according to claim 5,
wherein the multimode excitation light is excitation light for distributed Raman amplification, and
the reflection layer is formed in a length corresponding to at least an effective length of the distributed Raman amplification, in a direction parallel to a direction in which signal light propagates.

9. An optical amplifier, comprising:
a multimode optical transmission medium including
a plurality of cores,
a plurality of separated first claddings, each of the first claddings covering one of the plurality of cores, and
a second cladding that covers the plurality of first claddings;
a reflection layer that covers the second cladding and has reflection characteristics with respect to a wavelength band of multimode light;
a multimode excitation light source that outputs multimode excitation light that is propagated in the multimode optical transmission medium; and
a plurality of couplers that introduce the multimode excitation light that is output from the multimode excitation light source, to the plurality of separated first claddings and the second cladding inside the reflection layer of the multimode optical transmission medium.

10. A multimode optical transmission medium, comprising:
a plurality of cores;
first claddings that cover each of the plurality of cores;
a second cladding that covers the plurality of first claddings; and
a reflection layer that covers the second cladding and has reflection characteristics with respect to a wavelength band of multimode light, the reflection layer being a metal film of Invar alloy or Kovar alloy.

\* \* \* \* \*